(12) United States Patent
Black et al.

(10) Patent No.: US 11,078,111 B2
(45) Date of Patent: Aug. 3, 2021

(54) AUTOMOTIVE INTERIORS AND COVER GLASS ARTICLES WITH IMPROVED HEADFORM IMPACT PERFORMANCE AND POST-BREAKAGE VISIBILITY

(71) Applicant: CORNING INCORPORATED, Corning, NY (US)

(72) Inventors: Matthew Lee Black, Naples, NY (US); Khaled Layouni, Painted Post, NY (US); Yawei Sun, Elmira, NY (US); Chunhe Zhang, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 16/517,105

(22) Filed: Jul. 19, 2019

(65) Prior Publication Data

US 2020/0023738 A1 Jan. 23, 2020

Related U.S. Application Data

(60) Provisional application No. 62/749,187, filed on Oct. 23, 2018, provisional application No. 62/702,108, filed on Jul. 23, 2018.

(51) Int. Cl.
*C03C 21/00* (2006.01)
*B60K 35/00* (2006.01)
(Continued)

(52) U.S. Cl.
CPC ............ *C03C 21/002* (2013.01); *B60K 35/00* (2013.01); *G02B 1/115* (2013.01); *H05K 5/0017* (2013.01);
(Continued)

(58) Field of Classification Search
CPC ........ Y10T 428/315; C02C 21/00–003; B32B 17/10137; C03C 21/00–003
See application file for complete search history.

(56) References Cited

U.S. PATENT DOCUMENTS

| 4,455,338 A | 6/1984 | Henne |
| 4,899,507 A | 2/1990 | Mairlot |

(Continued)

FOREIGN PATENT DOCUMENTS

| CN | 203825589 U | 9/2014 |
| CN | 102566841 B | 4/2015 |

(Continued)

OTHER PUBLICATIONS

Thesis of Kyriaki Datsiou, "Design and Performance of Cold Bent Glass", 2017 (Year: 2017).*

(Continued)

*Primary Examiner* — Z. Jim Yang
(74) *Attorney, Agent, or Firm* — Payal A. Patel

(57) ABSTRACT

Embodiments of glass articles including a compressive stress (CS) region and a central tension (CT) region, wherein a portion of the CS region extends from the first major surface to a depth of compression (DOC), wherein, when the glass article is in a substantially flat configuration, the CT region has a maximum value ($CT_{flat}$) that is about 60 MPa or less, and wherein, when the glass article is in a cold bent configuration, CT region comprises a maximum value ($CT_{bent}$), wherein $CT_{bent}/CT_{flat} < 1.4$. Embodiments of automotive interior systems including such glass articles are provided, along with methods for forming a glass article and for forming an automotive interior system are also disclosed.

30 Claims, 10 Drawing Sheets

(51) Int. Cl.
  *G02B 1/115* (2015.01)
  *H05K 5/00* (2006.01)
  *H05K 5/02* (2006.01)
  *H05K 5/03* (2006.01)

(52) U.S. Cl.
  CPC ............ *H05K 5/0243* (2013.01); *H05K 5/03* (2013.01); *B60K 2370/1434* (2019.05); *B60K 2370/152* (2019.05); *B60K 2370/37* (2019.05); *B60K 2370/39* (2019.05); *Y10T 428/315* (2015.01)

(56) References Cited

U.S. PATENT DOCUMENTS

| | | | |
|---|---|---|---|
| 4,985,099 | A | 1/1991 | Mertens et al. |
| 6,086,983 | A | 7/2000 | Yoshizawa |
| 6,332,690 | B1 | 12/2001 | Murofushi |
| 6,582,799 | B1 | 6/2003 | Brown et al. |
| 7,375,782 | B2 | 5/2008 | Yamazaki et al. |
| 8,344,369 | B2 | 1/2013 | Yamazaki et al. |
| 8,549,885 | B2 | 10/2013 | Dannoux et al. |
| 8,833,106 | B2 | 9/2014 | Dannoux et al. |
| 8,854,623 | B2 | 10/2014 | Fontaine et al. |
| 8,912,447 | B2 | 12/2014 | Leong et al. |
| 9,061,934 | B2 | 6/2015 | Bisson et al. |
| 9,593,042 | B2 | 3/2017 | Hu et al. |
| 9,656,906 | B2 | 5/2017 | Akiba et al. |
| 9,802,485 | B2 | 10/2017 | Masuda et al. |
| 9,895,975 | B2 | 2/2018 | Lee et al. |
| 9,902,640 | B2 | 2/2018 | Dannoux et al. |
| 9,931,817 | B2 | 4/2018 | Rickerl |
| 10,131,118 | B2 | 11/2018 | Kang et al. |
| 2007/0223121 | A1 | 9/2007 | Franck et al. |
| 2009/0179840 | A1 | 7/2009 | Tanaka et al. |
| 2009/0185127 | A1 | 7/2009 | Tanaka et al. |
| 2010/0031590 | A1 | 2/2010 | Buchwald et al. |
| 2011/0293942 | A1* | 12/2011 | Cornejo ............... C03C 3/083 428/410 |
| 2012/0202030 | A1 | 8/2012 | Kondo et al. |
| 2013/0088441 | A1 | 4/2013 | Chung et al. |
| 2014/0014260 | A1 | 1/2014 | Chovvdhury et al. |
| 2014/0036428 | A1 | 2/2014 | Leong Chee Seng et al. |
| 2014/0087193 | A1* | 3/2014 | Cites ............. B32B 17/10036 428/410 |
| 2015/0147538 | A1 | 5/2015 | Ishimaru et al. |
| 2015/0166406 | A1 | 6/2015 | Ishimaru et al. |
| 2015/0166407 | A1* | 6/2015 | Varshneya ........... C03C 21/008 428/174 |
| 2015/0210588 | A1* | 7/2015 | Chang ................ C03C 15/00 361/750 |
| 2015/0246507 | A1 | 9/2015 | Brown et al. |
| 2015/0336357 | A1 | 11/2015 | Kang et al. |
| 2016/0052241 | A1 | 2/2016 | Zhang |
| 2016/0075111 | A1* | 3/2016 | Dixon ............. B32B 17/10036 428/172 |
| 2016/0102011 | A1* | 4/2016 | Hu ..................... C03C 10/00 428/155 |
| 2016/0122239 | A1* | 5/2016 | Amin ................. C03C 3/097 428/220 |
| 2016/0122240 | A1* | 5/2016 | Oram ................. C03C 21/002 428/220 |
| 2016/0207290 | A1* | 7/2016 | Cleary ............ B32B 17/10761 |
| 2016/0207819 | A1 | 7/2016 | Cleary et al. |
| 2016/0297176 | A1 | 10/2016 | Rickerl |
| 2016/0306451 | A1 | 10/2016 | Isoda et al. |
| 2016/0318796 | A1 | 11/2016 | Masuda |
| 2016/0354996 | A1 | 12/2016 | Alder et al. |
| 2016/0356760 | A1 | 12/2016 | Roussev et al. |
| 2016/0375808 | A1 | 12/2016 | Etienne et al. |
| 2017/0008377 | A1* | 1/2017 | Fisher .................. B60J 1/004 |
| 2017/0021661 | A1 | 1/2017 | Pelucchi |
| 2017/0022092 | A1* | 1/2017 | DeMartino ....... B32B 17/10018 |
| 2017/0057205 | A1* | 3/2017 | Notsu ............. B32B 17/10036 |
| 2017/0066223 | A1* | 3/2017 | Notsu ................ B32B 17/06 |
| 2017/0082577 | A1* | 3/2017 | Roussev ............... G01N 27/72 |
| 2017/0197384 | A1 | 7/2017 | Finkeldey et al. |
| 2017/0197561 | A1 | 7/2017 | McFarland |
| 2017/0197870 | A1* | 7/2017 | Finkeldey ........ B32B 17/10045 |
| 2017/0217815 | A1 | 8/2017 | Dannoux et al. |
| 2017/0233287 | A1* | 8/2017 | Li ......................... C03C 4/18 428/172 |
| 2017/0247291 | A1* | 8/2017 | Hatano ................. C03C 3/087 |
| 2017/0305786 | A1* | 10/2017 | Roussev ............... C03C 21/002 |
| 2017/0327402 | A1 | 11/2017 | Fujii et al. |
| 2017/0334770 | A1* | 11/2017 | Luzzato .................. C03C 4/18 |
| 2017/0349473 | A1* | 12/2017 | Moriya ............... C03B 23/0357 |
| 2018/0009697 | A1* | 1/2018 | He ..................... C03B 23/0302 |
| 2018/0009706 | A1* | 1/2018 | Luo .................... C03C 21/008 |
| 2018/0050948 | A1* | 2/2018 | Faik ................... B60K 37/06 |
| 2018/0065886 | A1* | 3/2018 | Akatsuka ............. C03C 3/085 |
| 2018/0072618 | A1* | 3/2018 | Hu ..................... C03C 3/085 |
| 2018/0079684 | A1 | 3/2018 | Hatano et al. |
| 2018/0105461 | A1* | 4/2018 | Schneider ............ C03C 17/30 |
| 2018/0111569 | A1 | 4/2018 | Faik et al. |
| 2018/0147985 | A1 | 5/2018 | Brown et al. |
| 2018/0149777 | A1 | 5/2018 | Brown |
| 2018/0149907 | A1 | 5/2018 | Gahagan et al. |
| 2018/0186674 | A1* | 7/2018 | Kumar ................. C03B 23/023 |
| 2018/0188869 | A1 | 7/2018 | Boggs et al. |
| 2018/0208131 | A1* | 7/2018 | Mattelet ................ C03C 3/091 |
| 2018/0210118 | A1 | 7/2018 | Gollier et al. |
| 2018/0215651 | A1* | 8/2018 | Akiba ................. C03C 21/002 |
| 2018/0230045 | A1 | 8/2018 | Ohkawa |
| 2018/0245125 | A1 | 8/2018 | Tsai et al. |
| 2018/0251400 | A1* | 9/2018 | Bookbinder ............. C03C 4/18 |
| 2018/0297892 | A1* | 10/2018 | Lee .................... C03C 3/083 |
| 2018/0345644 | A1 | 12/2018 | Kang et al. |
| 2019/0022979 | A1* | 1/2019 | Luzzato ................ B32B 17/06 |
| 2019/0248702 | A1* | 8/2019 | Lee .................. B32B 17/10128 |
| 2019/0276355 | A1* | 9/2019 | Meinhardt ............ C03C 21/002 |

FOREIGN PATENT DOCUMENTS

| | | |
|---|---|---|
| CN | 104679341 A | 6/2015 |
| CN | 204463066 U | 7/2015 |
| CN | 104843976 A | 8/2015 |
| CN | 105511127 A | 4/2016 |
| CN | 108779025 A | 11/2018 |
| DE | 4415878 A1 | 11/1995 |
| DE | 102004022008 A1 | 12/2004 |
| DE | 102013214108 A1 | 2/2015 |
| FR | 2918411 B1 | 10/2013 |
| GB | 2011316 A | 7/1979 |
| JP | 3059337 U | 6/1991 |
| JP | 11-060293 A | 3/1999 |
| JP | 2003-500260 A | 1/2003 |
| JP | 2013-084269 A | 5/2013 |
| JP | 2015092422 A | 5/2015 |
| JP | 5748082 B2 | 7/2015 |
| JP | 2016000668 A | 1/2016 |
| JP | 2016000669 A | 1/2016 |
| JP | 2016000670 A | 1/2016 |
| JP | 2016031696 A | 3/2016 |
| JP | 05976561 B2 | 8/2016 |
| JP | 2016173794 A | 9/2016 |
| JP | 2016-207200 A | 12/2016 |
| JP | 2016203609 A | 12/2016 |
| KR | 10-2016-0144008 A | 12/2016 |
| WO | WO-9703763 A1 * | 2/1997 ............ B32B 17/10 |
| WO | 9801649 A1 | 1/1998 |
| WO | 00/73062 A1 | 12/2000 |
| WO | 2007108861 A1 | 9/2007 |
| WO | 2012058084 A2 | 5/2012 |
| WO | 2014/175371 A1 | 10/2014 |
| WO | 2014167910 A1 | 10/2014 |
| WO | 2015031594 A2 | 3/2015 |
| WO | 2016/007815 A1 | 1/2016 |
| WO | 2016/018975 A1 | 2/2016 |
| WO | 2016/028622 A1 | 2/2016 |
| WO | 2016044360 A1 | 3/2016 |
| WO | 2016/125713 A1 | 8/2016 |
| WO | 2016/136758 A1 | 9/2016 |
| WO | 2016196531 A1 | 12/2016 |

(56) References Cited

FOREIGN PATENT DOCUMENTS

| WO | 2016196546 A1 | 12/2016 | | |
|---|---|---|---|---|
| WO | WO-2017012913 A1 * | 1/2017 | ............. | C03C 3/091 |
| WO | 2017/065286 A1 | 4/2017 | | |
| WO | 2017070283 A2 | 4/2017 | | |
| WO | 2017155932 A1 | 9/2017 | | |
| WO | 2018005646 A1 | 1/2018 | | |
| WO | 2018009504 A1 | 1/2018 | | |
| WO | 2018075853 A1 | 4/2018 | | |
| WO | 2018081068 A1 | 5/2018 | | |
| WO | 2018125683 A1 | 7/2018 | | |
| WO | 2019055667 A1 | 3/2019 | | |

OTHER PUBLICATIONS

Invitation to Pay Additional Fees of the International Searching Authority; PCT/US2019/041758; dated Oct. 25, 2019; 15 Pages; European Patent Office.

International Search Report and Written Opinion of the European International Searching Authority; PCT/US2019/041758; dated Dec. 13, 2019; 24 Pgs.

International Search Report and Written Opinion of the International Searching Authority; PCT/US19/041758; dated Dec. 13, 2019; 22 Pages; European Patent Office.

* cited by examiner

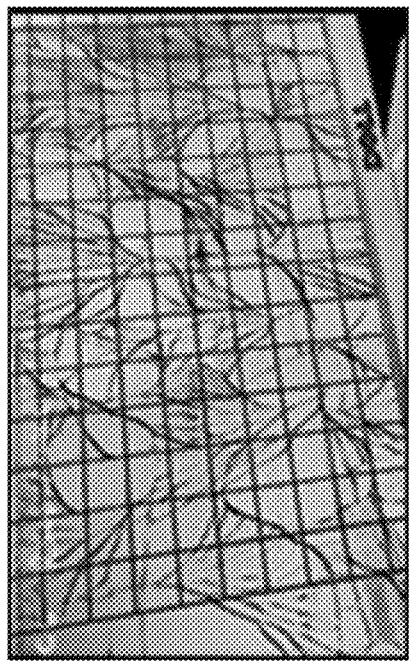
FIG. 2B R500, Convex
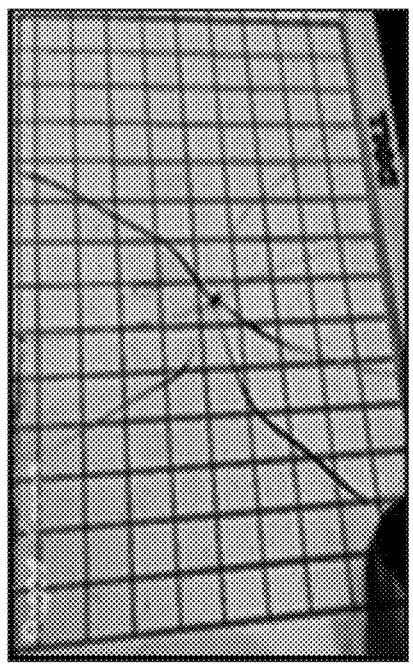
FIG. 2A R1000, Convex

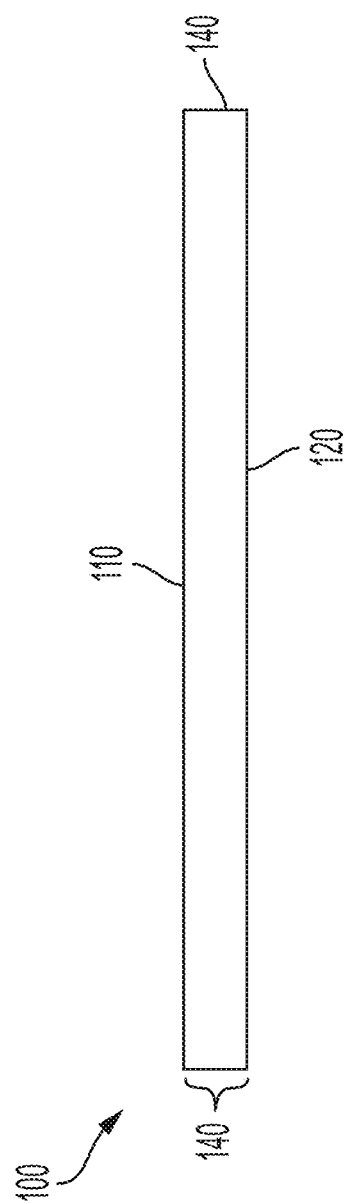

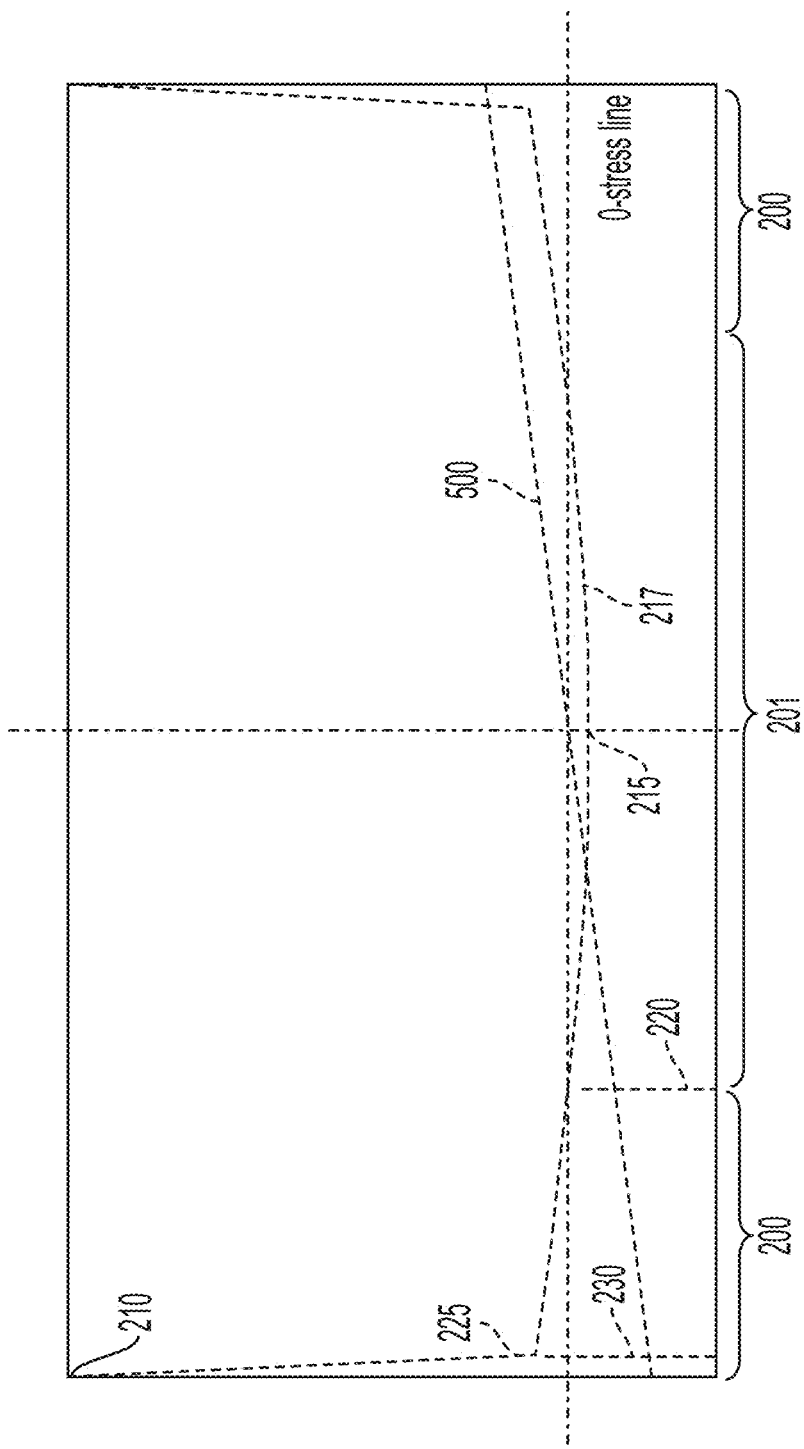

AUTOMOTIVE INTERIORS AND COVER GLASS ARTICLES WITH IMPROVED HEADFORM IMPACT PERFORMANCE AND POST-BREAKAGE VISIBILITY

CROSS-REFERENCE TO RELATED APPLICATIONS

This application claims the benefit of priority under 35 U.S.C. § 119 of U.S. Provisional Application Ser. No. 62/749,187 filed on Oct. 23, 2018 and U.S. Provisional Application Ser. No. 62/702,108 filed on Jul. 23, 2018, the content of which are relied upon and incorporated herein by reference in their entirety.

BACKGROUND

The disclosure relates to automotive interiors and cover glass articles that have improved headform impact and post-breakage visibility, and more particularly to automotive interiors with curved cover glass articles having improved headform impact and post-breakage visibility.

Glass as a cover material is gaining adoption in automotive interior applications because of its scratch resistance and optical properties. To date, glass articles currently used inside of automobiles, have been limited to either flat glass or glass that is bent to very large bend radius (e.g., often greater than 1000 mm) using a hot forming process.

Glass articles used in automotive interior applications are required to pass safety regulations such as the headform impact test, as well as other customer-desired functional features such as post-breakage visibility.

SUMMARY

A first aspect of this disclosure pertains to a glass article comprising: a first major surface, a second major surface, a minor surface connecting the first major surface and the second major surface, and a thickness (t) (millimeters); a compressive stress (CS) region; and a central tension (CT) region, wherein the CS region and the CT region define a stress profile along the thickness, wherein a portion of the CS region extends from the first major surface to a depth of compression (DOC), wherein, when the glass article is in a substantially flat configuration, the CT region has a maximum value ($CT_{flat}$) that is about 60 MPa or less, and wherein, when the glass article is in a cold bent configuration, CT region comprises a maximum value ($CT_{bent}$), wherein $CT_{bent}/CT_{flat} < 1.4$.

A second aspect of this disclosure pertains to an automotive interior system comprising: a base; and a glass article disposed on the base, wherein the glass article comprises a first major surface, a second major surface having a first radius of curvature of about 200 mm or greater, a minor surface connecting the first major surface and the second major surface and defining a thickness (t), a compressive stress (CS) region with a surface compressive stress value in a range from about 900 MPa to about 1500 MPa; and a central tension (CT) region having a maximum CT value of about 60 MPa or less, wherein the CS region and the CT region define a stress profile along the thickness, wherein a portion of the CS region extends from the first major surface to a depth of compression (DOC); and wherein, when an impactor having a mass of 6.8 kg impacts the first major surface at an impact velocity of 5.35 m/s to 6.69 m/s, the deceleration of the impactor is 120 g (g-force) or less.

A third aspect of this disclosure pertains to a method for forming a glass article comprising: strengthening a glass sheet having a first major surface, a second major surface, and a minor surface connecting the first major surface and the second major surface defining a thickness (t) to provide a first strengthened glass article having a first compressive stress (CS) region having a CS in a range from about 600 MPa to about 800 MPa, and a first central tension (CT) region; and strengthening the first strengthened glass article to provide the glass article comprising a final CS region comprising a surface CS value in a range from about 900 MPa to about 1500 MPa, and a final CT stress region having a maximum CT value of about 60 MPa or less.

A fourth aspect of this disclosure pertains to a method for forming an automotive interior system comprising affixing a display or touch panel to a cold-bent glass article, as described herein, to provide a module; and affixing the module to a base of an automotive interior system. In one or more embodiments, the method includes affixing the display or touch panel to the cold-bent glass article comprises cold-bending the glass article before affixing the display or touch panel to the cold-bent glass article.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIGS. 2A and 2B are images showing the effect of bending radii on glass fragmentation and post-breakage visibility.

FIG. 3 is a side view of a glass article according to one or more embodiments.

FIG. 10 is a cross-sectional view of a modeled glass article according to one or more embodiments showing a stress profile with a parabolic-like CT region.

DETAILED DESCRIPTION

Reference will now be made in detail to the present preferred embodiment(s), examples of which are illustrated in the accompanying drawings. As used herein, the terms "glass article" is used in their broadest sense to include any object made wholly or partly of glass. Glass-articles include laminates of glass and non-glass materials, laminates of glass and crystalline materials, and glass-ceramics (including an amorphous phase and a crystalline phase). Unless otherwise specified, all compositions are expressed in terms of mole percent (mol %).

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Thus, for example, a glass article that is "substantially free of MgO" is one in which MgO is not actively added or batched into the glass article, but may be present in very small amounts as a contaminant.

Figure 1:
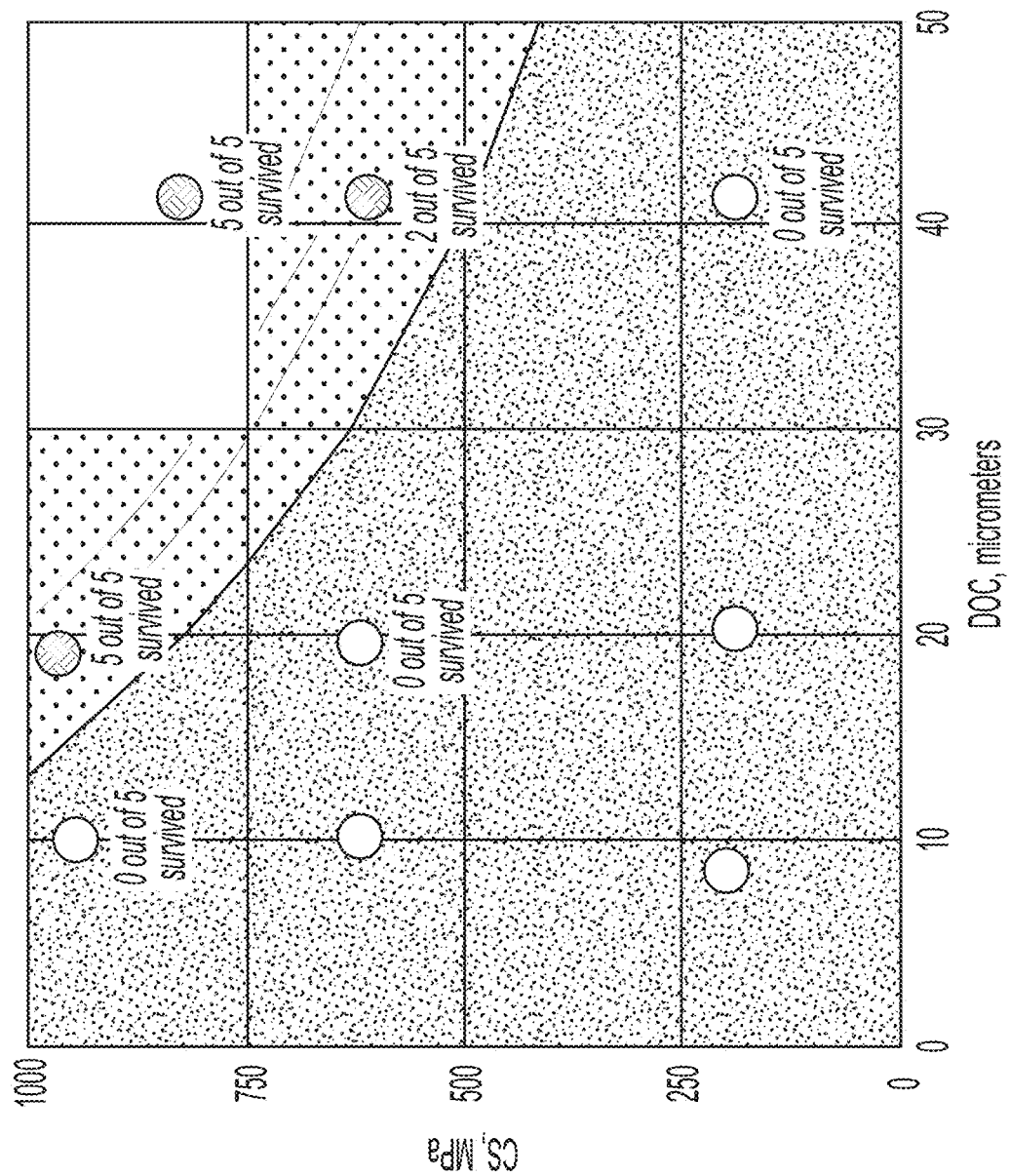
FIG. 1 is a plot showing the headform impact test performance for glass articles having different CS and DOC values.

Glass articles with higher strength in the form of higher compressive stress can widen the design window of glass articles that can pass the headform impact test. FIG. 1 is a plot of the headform impact performance of glass articles having differing surface compressive stress (CS) and depth of compressive stress (DOC). Glass articles with a relatively high level of surface CS (e.g., 1000 MPa, 1200 MPa, or 1500 MPa) demonstrated a higher probability of surviving a headform impact test.

The post-breakage visibility is heavily affected by glass fragmentation, which is dominated by the maximum tensile stress inside strengthened glass articles. For cold bent curved glass articles (as described herein), the maximum tensile stress is affected by the initial tensile stress imparted by the strengthening process used to form the strengthened glass article, and the tensile stress caused by the cold-bending process. FIGS. 2A and 2B show a comparison of glass fragmentation and post-breakage visibility for a cold-bent glass article that has a convex bend with a radius of curvature of 1000 mm (FIG. 2A) and a cold-bent glass article having a convex bend with a radius of curvature of 500 mm (FIG. 2B).

Various aspects of this disclosure pertain to glass articles that may be optionally curved, which can be used in automotive interior applications with and without displays or touch panels.

A first aspect of this disclosure pertains to a glass article that exhibits a stress profile having a maximum CT value that provides improved headform impact performance and post-breakage visibility when the glass article is flat or is cold-bent.

As shown in FIG. 3, the glass article 100 includes a first major surface 110, a second major surface 120, a minor surface 130 connecting the first major surface and the second major surface, and a thickness (t) (millimeters) 140. The thickness (t) may be in a range from about 0.1 mm to about 2 mm, from about 0.2 mm to about 2 mm, from about 0.3 mm to about 2 mm, from about 0.4 mm to about 2 mm, from about 0.5 mm to about 2 mm, from about 0.55 mm to about 2 mm, from about 0.6 mm to about 2 mm, from about 0.7 mm to about 2 mm, from about 0.8 mm to about 2 mm, from about 0.9 mm to about 2 mm, from about 1 mm to about 2 mm, from about 1.1 mm to about 2 mm, from about 1.2 mm to about 2 mm, from about 1.4 mm to about 2 mm, from about 1.5 mm to about 2 mm, from about 0.1 mm to about 1.8 mm, from about 0.1 mm to about 1.6 mm, from about 0.1 mm to about 1.5 mm, from about 0.1 mm to about 1.4 mm, from about 0.1 mm to about 1.3 mm, from about 0.1 mm to about 1.2 mm, from about 0.1 mm to about 1.1 mm, from about 0.1 mm to about 1 mm, from about 1 mm to about 1.8 mm, from about 1.1 mm to about 1.7 mm, from about 1.2 mm to about 1.6 mm, or from about 1.3 mm to about 1.5 mm.

Figure 4:
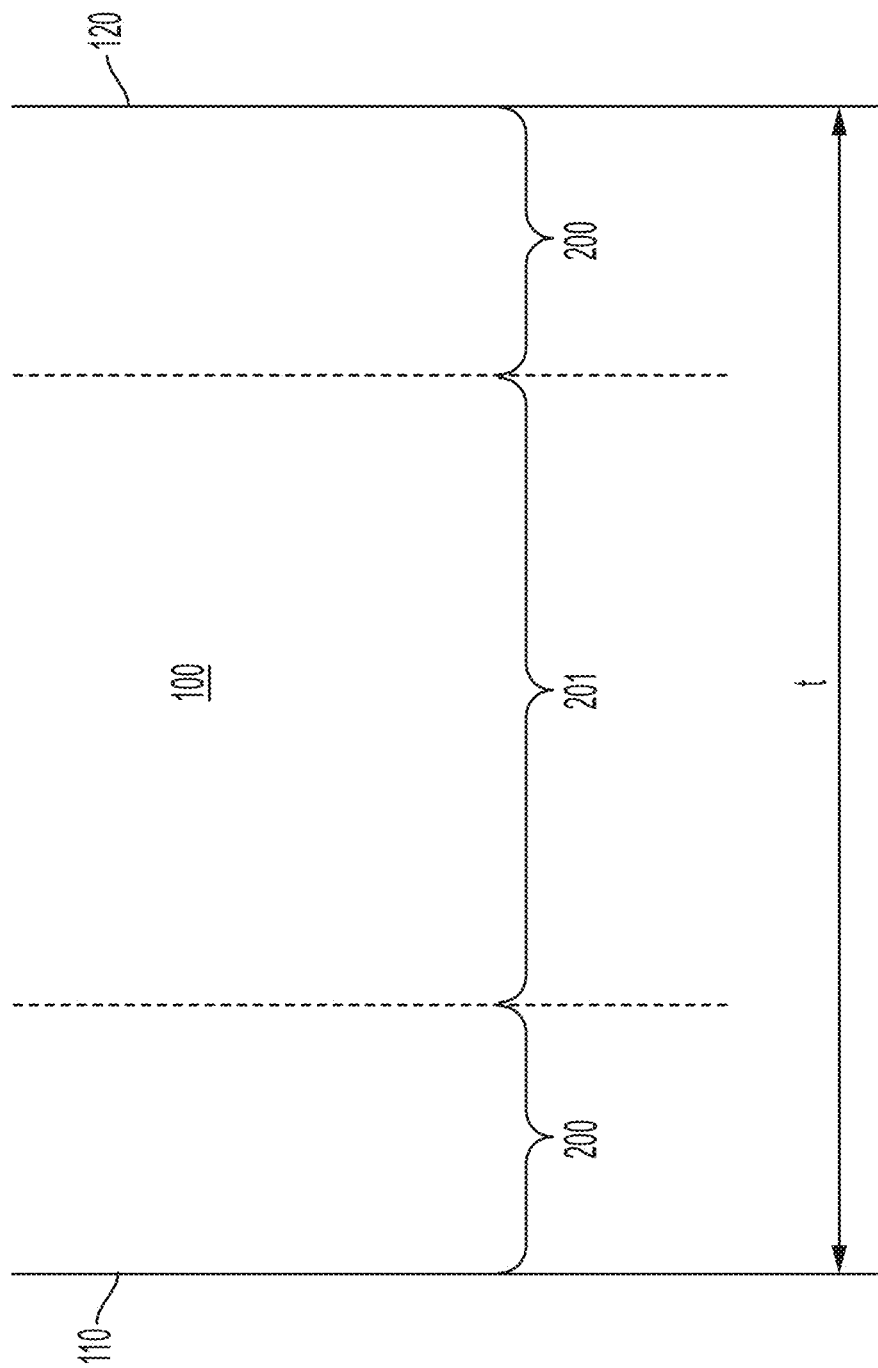
FIG. 4 and FIG. 5 are cross-sectional illustrations of a glass article showing the stress profile and its regions.

As shown in FIG. 4, the glass article has a compressive stress (CS) region 200 and a central tension or tensile (CT) region 201. In one or more embodiments, a portion of the CS region extends from the first major surface 110 to a depth of compression (DOC). As used herein, DOC refers to the depth at which the stress within the glass article changes from compressive to tensile stress. At the DOC, the stress crosses from a positive (compressive) stress to a negative (tensile) stress (e.g., 210 in FIG. 4) and thus exhibits a stress value of zero. According to the convention normally used in the art, compression is expressed as a negative (<0) stress and tension is expressed as a positive (>0) stress. Throughout this description, however, CS is expressed as a positive or absolute value—i.e., as recited herein, CS=|CS|.

Figure 5:
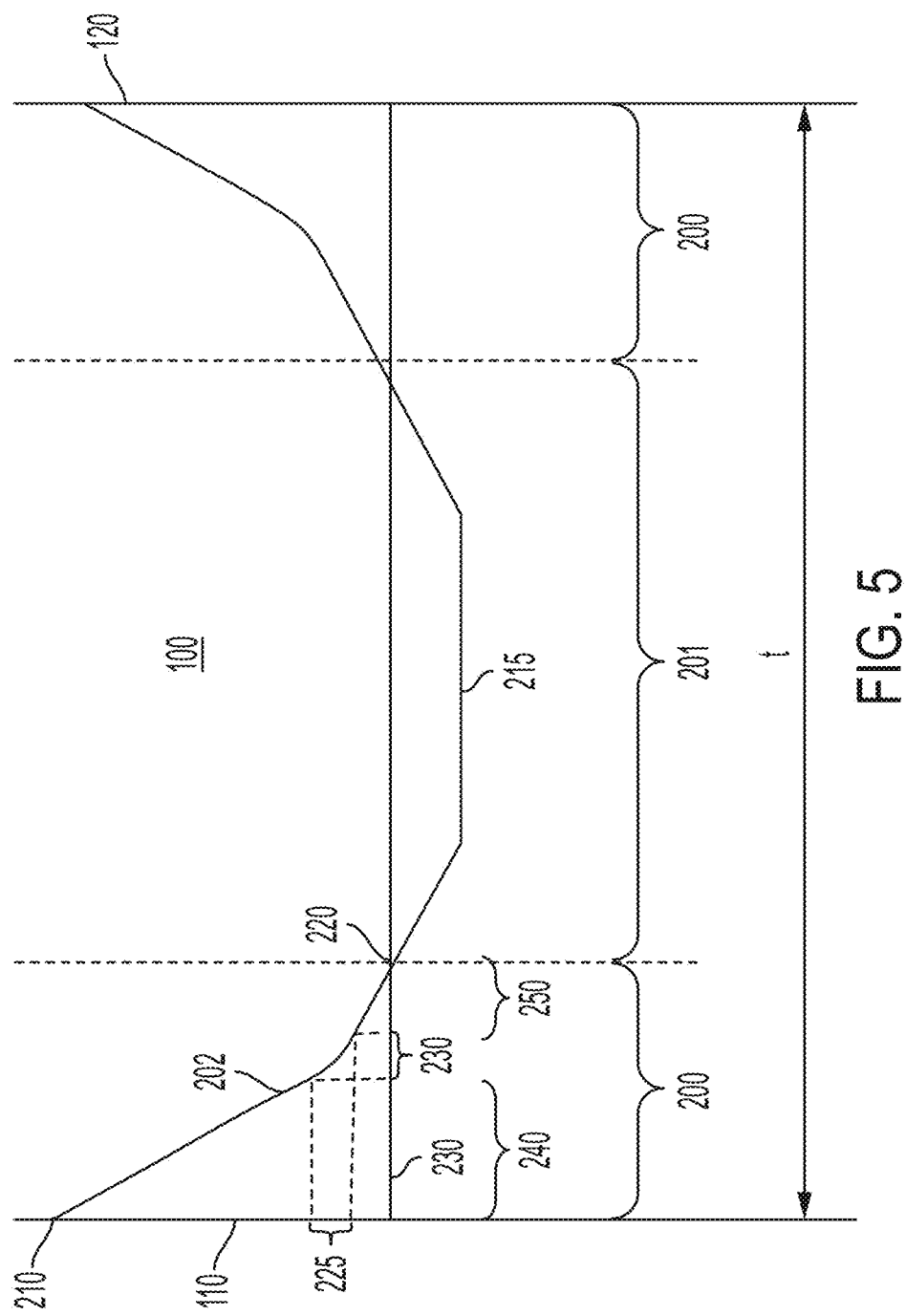

As shown in FIG. 5, the CS region and the CT region define a stress profile along 202 the thickness (t). The CS region 200 has a surface CS 210, the CT region 210 has a maximum CT value 215, and a DOC 220 at which the stress profile 202 turns from compressive to tensile. In one or more embodiments, the CS region 200 may include a range of compressive stress values at a specific depth range that is less than the surface CS (referred herein as the "knee stress" range) 225. The depth of the knee stress range 230 is referred to herein as a depth of compressive stress layer or DOL (which may also be a range). As used herein, reference to the DOC and DOL is with respect to each depth from one major surface (either the first major surface 110 or the second surface 120), with the understanding that such DOC or DOL may also be present from the other surface. In one or more embodiments, the glass article is substantially free of any knee stress or DOL and exhibits a stress profile along the CS region that decreases substantially linearly from the surface CS to the DOC.

In one or more embodiments, when the glass article is in a substantially flat configuration, the CT region has a maximum value ($CT_{flat}$). In one or more embodiments, when the glass article is in a cold-bent configuration, CT region comprises a maximum value ($CT_{bent}$).

As used herein, the terms "cold-bent," or "cold-bending" refers to curving the glass article at a cold-bend temperature which is less than the softening point of the glass (as described herein). The term "cold-bendable" refers to the capability of a glass article to be cold-bent. A feature of a cold-bent glass article is asymmetric surface compressive stress between the first major surface 110 and the second major surface 120. In one or more embodiments, prior to the cold-bending process or being cold-bent, the respective compressive stresses in the first major surface 110 and the second major surface 120 of the glass article are substantially equal. In one or more embodiments in which the glass article is unstrengthened, the first major surface 110 and the second major surface 120 exhibit no appreciable compressive stress, prior to cold-bending. In one or more embodiments in which the glass article is strengthened (as described herein), the first major surface 110 and the second major surface 120 exhibit substantially equal compressive stress with respect to one another, prior to cold-bending. In one or more embodiments, after cold-bending, the compressive stress on the surface having a concave shape after bending increases. In other words, the compressive stress on the concave surface is greater after cold-bending than before cold-bending. Without being bound by theory, the cold-bending process increases the compressive stress of the glass article being shaped to compensate for tensile stresses imparted during bending and/or forming operations. In one or more embodiments, the cold-bending process causes the concave surface to experience compressive stresses, while the surface forming a convex shape after cold-bending experiences tensile stresses. The tensile stress experienced by the convex following cold-bending results in a net decrease in surface compressive stress, such that the compressive stress in convex surface of a strengthened glass article following cold-bending is less than the compressive stress on the same surface when the glass article is flat.

When a strengthened glass article is utilized, the first major surface and the second major surface comprise a compressive stress that is substantially equal to one another prior to cold-bending, and thus the first major surface can experience greater tensile stress during cold-bending without risking fracture. This allows for the strengthened glass article to conform to more tightly curved surfaces or shapes.

In one or more embodiments, the $CT_{flat}$ is about 60 MPa or less, about 50 MPa or less, about 40 MPa or less, about 30 MPa or less, or about 20 MPa or less. In one or more embodiments, the $CT_{flat}$ is in a range from about 5 MPa to about 60 MPa, from about 10 MPa to about 60 MPa, from about 15 MPa to about 60 MPa, from about 20 MPa to about 60 MPa, from about 25 MPa to about 60 MPa, from about 30 MPa to about 60 MPa, from about 35 MPa to about 60 MPa, from about 40 MPa to about 60 MPa, from about 45 MPa to about 60 MPa, from about 5 MPa to about 55 MPa, from about 5 MPa to about 50 MPa, from about 5 MPa to about 45 MPa, from about 5 MPa to about 40 MPa, from about 5 MPa to about 35 MPa, from about 5 MPa to about 30 MPa, from about 5 MPa to about 25 MPa, from about 5 MPa to about 20 MPa, from about 5 MPa to about 15 MPa, from about 10 MPa to about 50 MPa, from about 10 MPa to about 40 MPa, from about 10 MPa to about 30 MPa, from about 10 MPa to about 20 MPa, from about 15 MPa to about 50 MPa, from about 15 MPa to about 40 MPa, from about 15 MPa to about 30 MPa, or from about 15 MPa to about 20 MPa. In one or more embodiments, the glass article exhibits the relationship $CT_{bend}/CT_{flat}$ that is less than 1.4 (e.g., about 1.35 or less, about 1.3 or less, about 1.25 or less, about 1.2 or less, about 1.15 or less, about 1.1 or less, or about 1.05 or less). In one or more embodiments, the CTbend, CTflat and the combined CTbend and CTflat is less than the result of the equation (1).

$$52.029 - 42.032 * LN(t).$$  Equation (1)

In one or more embodiments, the CS region includes surface CS value that is in a range from about 900 MPa to about 1500 MPa, from about 950 MPa to about 1500 MPa, from about 1000 MPa to about 1500 MPa, from about 1050 MPa to about 1500 MPa, from about 1100 MPa to about 1500 MPa, from about 1150 MPa to about 1500 MPa, from about 1200 MPa to about 1500 MPa, from about 1250 MPa to about 1500 MPa, from about 1300 MPa to about 1500 MPa, from about 900 MPa to about 1450 MPa, from about 900 MPa to about 1400 MPa, from about 900 MPa to about 1350 MPa, from about 900 MPa to about 1300 MPa, from about 900 MPa to about 1250 MPa, from about 900 MPa to about 1200 MPa, from about 900 MPa to about 1100 MPa, from about 900 MPa to about 1050 MPa, or from about 1000 MPa to about 1100 MPa.

In one or more embodiments, a portion of the CS region comprises a spike region 240 and a tail region 250. The knee region 230 is disposed between the spike region and the tail region. In one or more embodiments, all points of the stress profile in the spike region 240 comprise a tangent having a slope that is in a range from −200 MPa/micrometer to −15 MPa/micrometer. For example, all points of the stress profile in the spike region 240 comprise a tangent having a slope that is in a range from −190 MPa/micrometer to −15 MPa/micrometer, from −180 MPa/micrometer to −15 MPa/micrometer, from −170 MPa/micrometer to −15 MPa/micrometer, from −160 MPa/micrometer to −15 MPa/micrometer, from −150 MPa/micrometer to −15 MPa/micrometer, from −140 MPa/micrometer to −15 MPa/micrometer, from −130 MPa/micrometer to −15 MPa/micrometer, from −120 MPa/micrometer to −15 MPa/micrometer, from −100 MPa/micrometer to −15 MPa/micrometer, from −90 MPa/micrometer to −15 MPa/micrometer, from −80 MPa/micrometer to −15 MPa/micrometer, from −70 MPa/micrometer to −15 MPa/micrometer, from −60 MPa/micrometer to −15 MPa/micrometer, from −50 MPa/micrometer to −15 MPa/micrometer, from −200 MPa/micrometer to −20 MPa/micrometer, from −200 MPa/micrometer to −30 MPa/micrometer, from −200 MPa/micrometer to −40 MPa/micrometer, from −200 MPa/micrometer to −50 MPa/micrometer, from −200 MPa/micrometer to −60 MPa/micrometer, from −200 MPa/micrometer to −70 MPa/micrometer, from −200 MPa/micrometer to −80 MPa/micrometer, from −200 MPa/micrometer to −90 MPa/micrometer, from −200 MPa/micrometer to −100 MPa/micrometer, from −200 MPa/micrometer to −110 MPa/micrometer, from −200 MPa/micrometer to −120 MPa/micrometer, from −200 MPa/micrometer to −130 MPa/micrometer, from −200 MPa/micrometer to −140 MPa/micrometer, from −200 MPa/micrometer to −150 MPa/micrometer, from −150 MPa/micrometer to −50 MPa/micrometer, from −125 MPa/micrometer to −75 MPa/micrometer, from −140 MPa/micrometer to −40 MPa/micrometer, from −140 MPa/micrometer to −65 MPa/micrometer, from −200 MPa/micrometer to −95, from −95 MPa/micrometer to −40 MPa/micrometer, from −40 MPa/micrometer to −95 MPa/micrometer, or from −40 MPa/micrometer to −65 MPa/micrometer.

In one or more embodiments, all points in the tail region comprise a tangent having a slope that is in a range from −3 MPa/micrometer to −0.01 MPa/micrometer (e.g., from −2.8 MPa/micrometer to −0.01 MPa/micrometer, from −2.6 MPa/micrometer to −0.01 MPa/micrometer, from −2.5 MPa/micrometer to −0.01 MPa/micrometer, from −2 MPa/micrometer to −0.01 MPa/micrometer, from −1.8 MPa/micrometer to −0.01 MPa/micrometer, from −1.6 MPa/micrometer to −0.01 MPa/micrometer, from −1.5 MPa/micrometer to −0.01 MPa/micrometer, from −1.4 MPa/micrometer to −0.01 MPa/micrometer, from −1.2 MPa/micrometer to −0.01 MPa/micrometer, from −1 MPa/micrometer to −0.01 MPa/micrometer, from −0.8 MPa/micrometer to −0.01 MPa/micrometer, from −0.6 MPa/micrometer to −0.01 MPa/micrometer, from −0.5 MPa/micrometer to −0.01 MPa/micrometer, from −3 MPa/micrometer to −0.1 MPa/micrometer, from −3 MPa/micrometer to −0.2 MPa/micrometer, from −3 MPa/micrometer to −0.3 MPa/micrometer, from −3 MPa/micrometer to −0.4 MPa/micrometer, from −3 MPa/micrometer to −0.5 MPa/micrometer, from −3 MPa/micrometer to −0.6 MPa/micrometer, from −3 MPa/micrometer to −0.7 MPa/micrometer, from −3 MPa/micrometer to −0.8 MPa/micrometer, from −3 MPa/micrometer to −0.9 MPa/micrometer, from −3 MPa/micrometer to −1 MPa/micrometer, from −3 MPa/micrometer to −1.1 MPa/micrometer, from −3 MPa/micrometer to −1.2 MPa/micrometer, from −3 MPa/micrometer to −1.4 MPa/ micrometer to −1.5 MPa/micrometer, from −3 MPa/micrometer to −1.6 MPa/micrometer, from −3 MPa/micrometer to −1.7 MPa/micrometer, from −3 MPa/micrometer to −1.8 MPa/micrometer, from −3 MPa/micrometer to −1.9 MPa/micrometer, from −3 MPa/micrometer to −2 MPa/micrometer, from −3 MPa/micrometer to −2.2 MPa/micrometer, from −3 MPa/micrometer to −2.4 MPa/micrometer, from −2.5 MPa/micrometer to −0.5 MPa/micrometer, or from −2 MPa/micrometer to −1 MPa/micrometer.

In one or more embodiments, the knee region is a transition region between the spike region and the tail region. In one or more embodiments, all points in the knee region comprise a tangent having a slope that is between the slopes of the tangents of all points in the spike region and the tail region.

In one or more embodiments, the spike region comprises a CS value in a range from greater than 200 MPa to about 1500 MPa (e.g., from about 250 MPa to about 1500 MPa, from about 300 MPa to about 1500 MPa, from about 350 MPa to about 1500 MPa, from about 400 MPa to about 1500 MPa, from about 450 MPa to about 1500 MPa, from about 500 MPa to about 1500 MPa, from about 550 MPa to about 1500 MPa, from about 600 MPa to about 1500 MPa, from about 650 MPa to about 1500 MPa, from about 700 MPa to about 1500 MPa, from about 750 MPa to about 1500 MPa, from about 800 MPa to about 1500 MPa, from about 850 MPa to about 1500 MPa, from about 900 MPa to about 1500 MPa, from about 950 MPa to about 1500 MPa, from about 1000 MPa to about 1500 MPa, from greater than about 200 MPa to about 1450 MPa, from greater than about 200 MPa to about 1400 MPa, from greater than about 200 MPa to about 1350 MPa, from greater than about 200 MPa to about 1300 MPa, from greater than about 200 MPa to about 1250 MPa, from greater than about 200 MPa to about 1200 MPa, from greater than about 200 MPa to about 1150 MPa, from greater than about 200 MPa to about 1100 MPa, from greater than about 200 MPa to about 1050 MPa, from greater than about 200 MPa to about 1000 MPa, or from about 500 MPa to about 900 MPa.

In one or more embodiments, the knee region comprises a CS value in a range from about 50 MPa to about 200 MPa, from about 60 MPa to about 200 MPa, from about 70 MPa to about 200 MPa, from about 80 MPa to about 200 MPa, from about 90 MPa to about 200 MPa, from about 100 MPa to about 200 MPa, from about 110 MPa to about 200 MPa, from about 120 MPa to about 200 MPa, from about 130 MPa to about 200 MPa, from about 140 MPa to about 200 MPa, from about 150 MPa to about 200 MPa, from about 50 MPa to about 190 MPa, from about 50 MPa to about 180 MPa, from about 50 MPa to about 170 MPa, from about 50 MPa to about 160 MPa, from about 50 MPa to about 150 MPa, from about 50 MPa to about 140 MPa, from about 50 MPa to about 130 MPa, from about 50 MPa to about 120 MPa, from about 50 MPa to about 110 MPa, from about 50 MPa to about 100 MPa, from about 50 MPa to about 90 MPa, from about 50 MPa to about 80 MPa, or from about 75 MPa to about 150 MPa.

In one or more embodiments, the DOL or the knee region may extend from about 10 micrometers to about 50 micrometers from the first major surface. For example, the DOL or knee region may extend from about 12 micrometers to about 50 micrometers, from about 14 micrometers to about 50 micrometers, from about 15 micrometers to about 50 micrometers, from about 16 micrometers to about 50 micrometers, from about 18 micrometers to about 50 micrometers, from about 20 micrometers to about 50 micrometers, from about 22 micrometers to about 50 micrometers, from about 24 micrometers to about 50 micrometers, from about 25 micrometers to about 50 micrometers, from about 26 micrometers to about 50 micrometers, from about 28 micrometers to about 50 micrometers, from about 30 micrometers to about 50 micrometers, from about 10 micrometers to about 48 micrometers, from about 10 micrometers to about 46 micrometers, from about 10 micrometers to about 45 micrometers, from about 10 micrometers to about 44 micrometers, from about 10 micrometers to about 42 micrometers, from about 10 micrometers to about 40 micrometers, from about 10 micrometers to about 38 micrometers, from about 10 micrometers to about 36 micrometers, from about 10 micrometers to about 35 micrometers, from about 10 micrometers to about 34 micrometers, from about 10 micrometers to about 32 micrometers, from about 10 micrometers to about 30 micrometers, from about 10 micrometers to about 28 micrometers, from about 10 micrometers to about 26 micrometers, from about 10 micrometers to about 25 micrometers, from about 10 micrometers to about 24 micrometers, from about 10 micrometers to about 22 micrometers, from about 10 micrometers to about 20 micrometers, from about 10 micrometers to about 18 micrometers, from about 10 micrometers to about 16 micrometers, from about 10 micrometers to about 15 micrometers, from about 10 micrometers to about 14 micrometers, from about 12 micrometers to about 18 micrometers, from about 14 micrometers to about 16 micrometers, from about 14 micrometers to about 18 micrometers, or from about 15 micrometers to about 20 micrometers.

In one or more embodiments, the tail region extends from about the knee region to the DOC, wherein the DOC is up to about 0.25 t. For example, the tail region extends from a depth of 20 micrometers to about 0.25 t, from a depth of 25 micrometers to about 0.25 t, from a depth of 30 micrometers to about 0.25 t, from a depth of 35 micrometers to about 0.25 t, from a depth of 40 micrometers to about 0.25 t, from a depth of 50 micrometers to about 0.25 t, from a depth of 75 micrometers to about 0.25 t, from a depth of 100 micrometers to about 0.25 t, from a depth of 20 micrometers to about 0.25 t, from a depth of 20 micrometers to about 0.21 t, from a depth of 20 micrometers to about 0.2 t, from a depth of 20 micrometers to about 0.18 t, from a depth of 20 micrometers to about 0.16 t, from a depth of 20 micrometers to about 0.15 t, from a depth of 20 micrometers to about 0.14 t, from a depth of 20 micrometers to about 0.12 t, from a depth of 20 micrometers to about 0.1 t, from a depth of 20 micrometers to about 0.08 t, or from a depth of 20 micrometers to about 0.06 t.

In one or more embodiments, all points of the stress profile along at least a portion of the CT region comprises comprise a tangent having a slope that is in a range from −1 MPa/micrometer to 1 MPa/micrometer (e.g., from −0.9 MPa/micrometer to 1 MPa/micrometers, from −0.8 MPa/micrometer to 1 MPa/micrometers, from −0.7 MPa/micrometer to 1 MPa/micrometers, from −0.6 MPa/micrometer to 1 MPa/micrometers, from −0.5 MPa/micrometer to 1 MPa/micrometers, from −0.4 MPa/micrometer to 1 MPa/micrometers, from −0.3 MPa/micrometer to 1 MPa/micrometers, from −0.2 MPa/micrometer to 1 MPa/micrometers, from −0.1 MPa/micrometer to 1 MPa/micrometers, from 0 MPa/micrometer to 1 MPa/micrometers, from 0.01 MPa/micrometer to 1 MPa/micrometers, from 0.2 MPa/micrometer to 1 MPa/micrometers, from −1 MPa/micrometer to 0.9 MPa/micrometers, from −1 MPa/micrometer to 0.8 MPa/micrometers, from −1 MPa/micrometer to 0.7 MPa/micrometers, from −1 MPa/micrometer to 0.6 MPa/micrometers, from −1 MPa/micrometer to 0.5 MPa/micrometers, from −1 MPa/micrometer to 0.4 MPa/micrometers, from −1 MPa/micrometer to 0.3 MPa/micrometers, from −1 MPa/micrometer to 0.2 MPa/micrometers, from −1 MPa/micrometer to 0.1 MPa/micrometers, from −1 MPa/micrometer to 0 MPa/micrometers, from −1 MPa/micrometer to −0.1 MPa/micrometers, from −1 MPa/micrometer to −0.2 MPa/micrometers, from −1 MPa/micrometer to −0.3 MPa/micrometers, from −1 MPa/micrometer to −0.4 MPa/micrometers, from −1 MPa/micrometer to −0.5 MPa/micrometers, or −0.5 MPa/micrometers to 0.5 MPa/micrometers. In one or more embodiments, at least 50% of the CT region comprises the tangent having a slope that is in a range from 1 MPa/micrometer to −1 MPa/micrometer or sub-ranges disclosed herein.

In one or more embodiments, the tail region may be curved or have a curvature that approaches a parabolic stress profile in the tail region. In one or more specific embodiments, all points of the stress profile in the tail region form a power-law profile having a power exponent, wherein the power exponent is in a range from about 1.2 to 3.4 (e.g., from about 1.3 to about 3.4, from about 1.4 to about 3.4, from about 1.5 to about 3.4, from about 1.6 to about 3.4, from about 1.7 to about 3.4, from about 1.8 to about 3.4, from about 1.9 to about 3.4, from about 2 to about 3.4, from about 1.2 to about 3.2, from about 1.2 to about 3, from about 1.2 to about 2.8, from about 1.2 to about 2.6, from about 1.2 to about 2.4, from about 1.2 to about 2, from about 1.2 to about 1.8, from about 1.2 to about 1.6, from about 1.5 to about 3, or from about 2 to about 2.5).

In one or more embodiments, a portion of the CT region or the entirety of the CT region may be curved or have a curvature that approaches a parabolic-like shape. In one or more specific embodiments, all points of the stress profile in a portion of the CT region or the entirety of the CT region form a power-law profile having a power exponent, wherein the power exponent is in a range from about 1.2 to 3.4 (e.g., from about 1.3 to about 3.4, from about 1.4 to about 3.4, from about 1.5 to about 3.4, from about 1.6 to about 3.4, from about 1.7 to about 3.4, from about 1.8 to about 3.4, from about 1.9 to about 3.4, from about 2 to about 3.4, from about 1.2 to about 3.2, from about 1.2 to about 3, from about 1.2 to about 2.8, from about 1.2 to about 2.6, from about 1.2 to about 2.4, from about 1.2 to about 2, from about 1.2 to about 1.8, from about 1.2 to about 1.6, from about 1.5 to about 3, or from about 2 to about 2.5).

In one or more embodiments, in some embodiments, the stress profile along the CT region may be approximated by equation (2):

$$\text{Stress}(x) = \text{MaxCT} - (((\text{MaxCT} \cdot (n+1))/0.5^n) \cdot |(x/t) - 0.5|^n) \quad (2)$$

In equation (2), the stress (x) is the stress value at position x. Here the stress is positive (tension). MaxCT is the maximum central tension as a positive value in MPa. The value x is position along the thickness (t) in micrometers, with a range from 0 to t; x=0 is one surface (110, in FIG. 3), x=0.5 t is the center of the glass article, stress(x)=MaxCT, and x=t is the opposite surface (120, in FIG. 3). MaxCT used in equation (2) may be in the range from about 5 MPa to about 60 MPa, and n is a fitting parameter from 1.5 to 5 (e.g., 2 to 4, 2 to 3 or 1.8 to 2.2) whereby n=2 can provide a parabolic stress profile, exponents that deviate from n=2 provide stress profiles with near parabolic stress profiles.

In one or more embodiments, the glass article is in a substantially flat configuration, as shown in FIG. 3.

Figure 6:
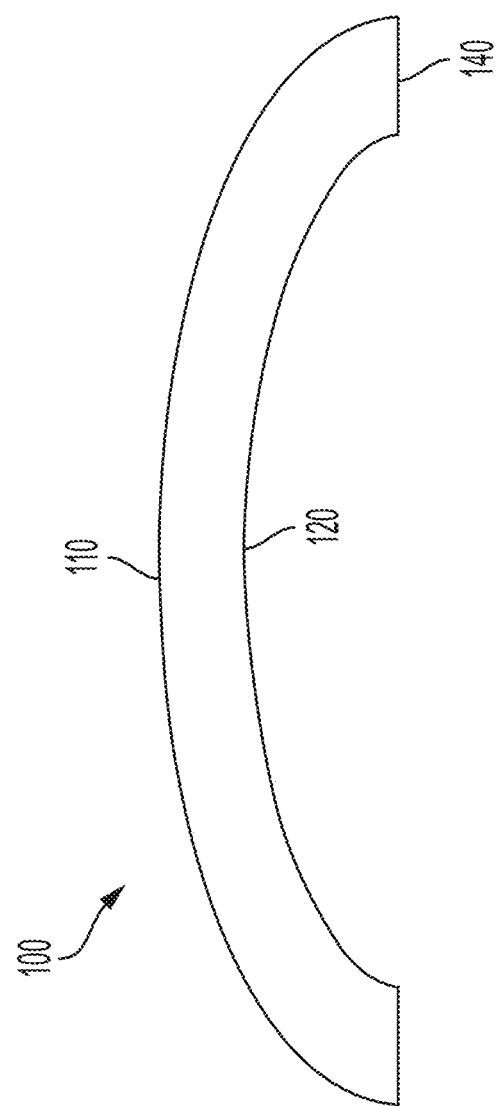
FIG. 6 is a cold-bent glass article according to one or more embodiments.
Figure 7:
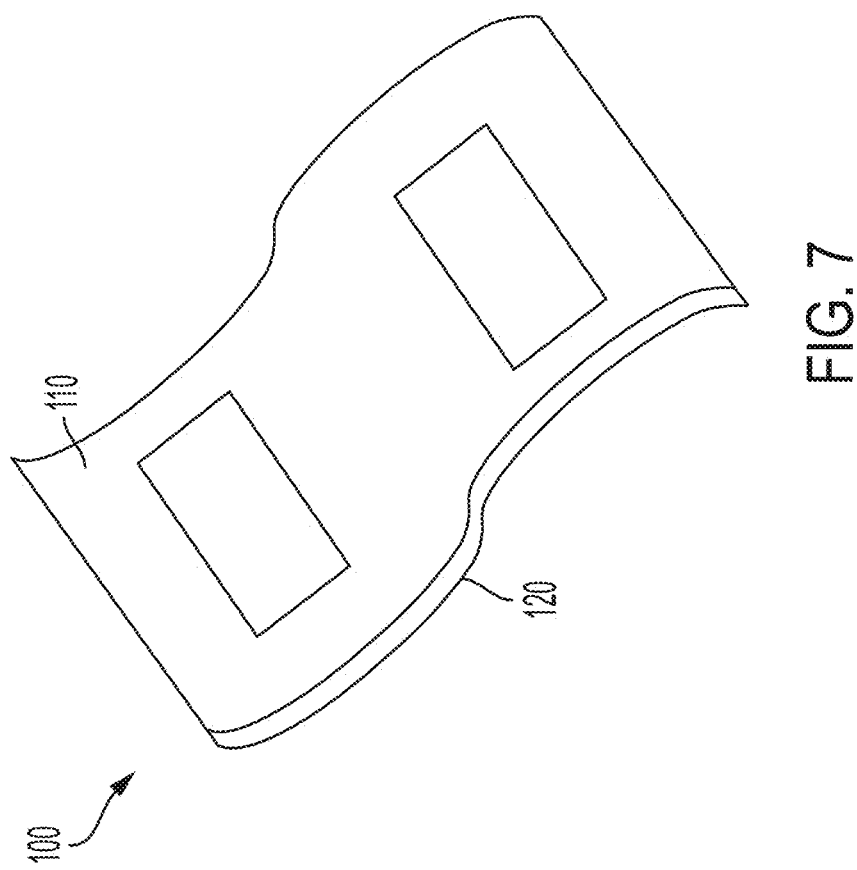
FIG. 7 is a cold-bent glass article according to one or more embodiments.

In one or more embodiments, the glass article is in the cold bent configuration and comprises a conical surface, a cylindrical surface or a developable surface. Examples of a cold-bent glass article are shown in FIG. 6 and FIG. 7. In one or more embodiments, the glass article includes a radius of curvature of about 20 mm or greater, 40 mm or greater, 50 mm or greater, 60 mm or greater, 100 mm or greater, 250 mm or greater or 500 mm or greater. For example, the radius of curvature may be in a range from about 20 mm to about 10,000 mm, from about 30 mm to about 10,000 mm, from about 40 mm to about 10,000 mm, from about 50 mm to about 10,000 mm, 60 mm to about 10,000 mm, from about 70 mm to about 10,000 mm, from about 80 mm to about 10,000 mm, from about 90 mm to about 10,000 mm, from about 100 mm to about 10,000 mm, from about 120 mm to about 10,000 mm, from about 140 mm to about 10,000 mm, from about 150 mm to about 10,000 mm, from about 160 mm to about 10,000 mm, from about 180 mm to about 10,000 mm, from about 200 mm to about 10,000 mm, from about 220 mm to about 10,000 mm, from about 240 mm to about 10,000 mm, from about 250 mm to about 10,000 mm, from about 260 mm to about 10,000 mm, from about 270 mm to about 10,000 mm, from about 280 mm to about 10,000 mm, from about 290 mm to about 10,000 mm, from about 300 mm to about 10,000 mm, from about 350 mm to about 10,000 mm, from about 400 mm to about 10,000 mm, from about 450 mm to about 10,000 mm, from about 500 mm to about 10,000 mm, from about 550 mm to about 10,000 mm, from about 600 mm to about 10,000 mm, from about 650 mm to about 10,000 mm, from about 700 mm to about 10,000 mm, from about 750 mm to about 10,000 mm, from about 800 mm to about 10,000 mm, from about 900 mm to about 10,000 mm, from about 950 mm to about 10,000 mm, from about 1000 mm to about 10,000 mm, from about 1250 mm to about 10,000 mm, from about 1500 mm to about 10,000 mm, from about 1750 mm to about 10,000 mm, from about 2000 mm to about 10,000 mm, from about 2500 mm to about 10,000 mm, from about 3000 mm to about 10,000 mm, from about 4000 mm to about 10,000 mm, from about 5000 mm to about 10,000 mm, from about 6000 mm to about 10,000 mm, from about 7000 mm to about 10,000 mm, from about 8000 mm to about 10,000 mm, from about 20 mm to about 9000 mm, from about 20 mm to about 8000 mm, from about 20 mm to about 7000 mm, from about 20 mm to about 6000 mm, from about 20 mm to about 5000 mm, from about 20 mm to about 4000 mm, from about 20 mm to about 3000 mm, from about 20 mm to about 2500 mm, from about 20 mm to about 2000 mm, from about 20 mm to about 1950 mm, from about 20 mm to about 1900 mm, from about 20 mm to about 1850 mm, from about 20 mm to about 1800 mm, from about 20 mm to about 1750 mm, from about 20 mm to about 1700 mm, from about 20 mm to about 1650 mm, from about 20 mm to about 1600 mm, from about 20 mm to about 1550 mm, from about 20 mm to about 1500 mm, from about 20 mm to about 1450 mm, from about 20 mm to about 1400 mm, from about 20 mm to about 1300 mm, from about 20 mm to about 1200 mm, from about 20 mm to about 1100 mm, from about 20 mm to about 1000 mm, from about 20 mm to about 950 mm, from about 20 mm to about 900 mm, from about 20 mm to about 850 mm, from about 20 mm to about 800 mm, from about 20 mm to about 750 mm, from about 20 mm to about 700 mm, from about 20 mm to about 650 mm, from about 20 mm to about 200 mm, from about 20 mm to about 550 mm, from about 20 mm to about 500 mm, from about 20 mm to about 450 mm, from about 20 mm to about 400 mm, from about 20 mm to about 350 mm, from about 20 mm to about 300 mm, from about 20 mm to about 250 mm, from about 20 mm to about 200 mm, from about 20 mm to about 150 mm, from about 20 mm to about 100 mm, from about 20 mm to about 50 mm, from about 60 mm to about 1400 mm, from about 60 mm to about 1300 mm, from about 60 mm to about 1200 mm, from about 60 mm to about 1100 mm, from about 60 mm to about 1000 mm, from about 60 mm to about 950 mm, from about 60 mm to about 900 mm, from about 60 mm to about 850 mm, from about 60 mm to about 800 mm, from about 60 mm to about 750 mm, from about 60 mm to about 700 mm, from about 60 mm to about 650 mm, from about 60 mm to about 600 mm, from about 60 mm to about 550 mm, from about 60 mm to about 500 mm, from about 60 mm to about 450 mm, from about 60 mm to about 400 mm, from about 60 mm to about 350 mm, from about 60 mm to about 300 mm, or from about 60 mm to about 250 mm. In one or more embodiments, glass articles having a thickness of less than about 0.4 mm may exhibit a radius of curvature that is less than about 100 mm, or less than about 60 mm.

In one or more embodiments, the first major surface comprises a first major surface CS value that is in a range from about 900 MPa to about 1500 MPa, and the second major surface comprises a second major surface CS value that differs from the first major surface CS value. In one or more embodiments, the first major surface CS is greater than the second major surface CS. In one or more embodiments, at least a portion of the first major surface forms a concave surface, and at the opposing portion of the second major surface forms a convex surface. In one or more embodiments, the first major surface CS is greater due to the cold-bent configuration of the glass article. The first major surface is compressed and forms a concave surface. The first major surface CS can be estimated as the sum of the surface CS before cold-bending and CS imparted from cold-bending, which can be calculated using Equation (3).

$$E*t/(2R),\quad\text{Equation (3):}$$

where E is Young's Modulus and R is the radius of curvature in mm.

CS (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

DOC may be measured by FSM or a scattered light polariscope (SCALP) depending on the ion exchange treatment. Where the stress in the glass article is generated by exchanging potassium ions into the glass article, FSM is used to measure DOC. Where the stress is generated by exchanging sodium ions into the glass article, SCALP is used to measure DOC. Where the stress in the glass article is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions ("Potassium DOL") in such glass articles is measured by FSM. Potassium DOL is distinguished from DOC because it represents the depth of potassium penetration as a result of an ion exchange process. Potassium DOL is typically less than the DOC for the articles described herein.

Maximum CT values are measured using a scattered light polariscope (SCALP) technique known in the art. Refracted near-field (RNF) method or SCALP may be used to measure the stress profile. When the RNF method is utilized to measure the stress profile, the maximum CT value provided by SCALP is utilized in the RNF method. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

Figure 8:
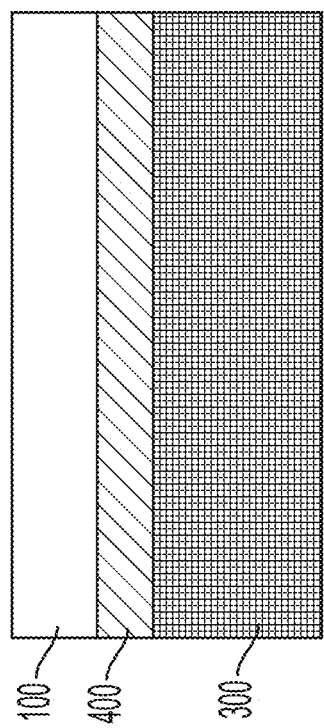
FIG. 8 is a side view of a glass article, adhesive and display or touch panel assembly.

As shown in FIG. 8, the glass article may include a display or touch panel 300 disposed on the first or second major surface. As shown in FIG. 8, the glass article may include an adhesive 400 disposed between the glass article (and specifically the first or second major surface) and the display or touch panel.

Although the glass article, adhesive and display or touch panel are shown in the flat configuration in FIG. 8, at least the glass article or both the glass article and display or touch panel are curved. In one or more embodiments, at least a portion of the first or second major surface comprise a radius of curvature in a range from about 20 mm to about 2000 mm.

In one or more embodiments, either one of or both the first major surface and the second major surface comprises a surface treatment. The surface treatment may cover at least a portion of the first major surface and the second major surface. The surface treatment may comprise any one or more of an easy-to-clean surface, an anti-glare surface, an anti-reflective surface, a haptic surface, and a decorative surface. In some embodiments, the surface treatment comprises at least two of any one of an easy-to-clean surface, an anti-glare surface, an anti-reflective surface, a haptic surface, and a decorative surface. In one example, the first major surface comprises the anti-glare surface and the second major surface comprises the anti-reflective surface. In another example, the first major surface comprises the anti-reflective surface and the second major surface comprises the anti-glare surface. In yet another example, the first major surface comprises either one of or both the anti-glare surface and the anti-reflective surface, and the second major surface comprises the decorative surface. The decorative surface may be disposed on at least a portion of a periphery of the glass article that surrounds an interior portion that is substantially free of the decorative surface. The decorative surface can comprise any one of a wood-grain design, a brushed metal design, a graphic design, a portrait, and a logo. In one or more embodiments, the anti-glare surface comprises an etched surface, and the anti-reflective surface comprises a multi-layer coating.

The anti-glare surface may be formed using an etching process and may exhibit a transmission haze 20% or less (e.g., about 15% or less, or about 10% or less), and a distinctiveness of image (DOI) of about 80 or less. As used herein, the terms "transmission haze" and "haze" refer to the percentage of transmitted light scattered outside an angular cone of about ±2.5° in accordance with ASTM procedure D1003. For an optically smooth surface, transmission haze is generally near zero. As used herein, the term "distinctness of image" is defined by method A of ASTM procedure D5767 (ASTM 5767), entitled "Standard Test Methods for Instrumental Measurements of Distinctness-of-Image Gloss of Coating Surfaces," the contents of which are incorporated herein by reference in their entirety. In accordance with method A of ASTM 5767, article reflectance factor measurements are made on the anti-glare surface at the specular viewing angle and at an angle slightly off the specular viewing angle. The values obtained from these measurements are combined to provide a DOI value. In particular, DOI is calculated according to the equation $$DOI = \left[1 - \frac{Ros}{Rs}\right] \times 100, \quad (1)$$

where Ros is the relative reflection intensity average between 0.2° and 0.4 away from the specular reflection direction, and Rs is the relative reflection intensity average in the specular direction (between +0.05° and −0.05°, centered around the specular reflection direction). If the input light source angle is +20° from the sample surface normal (as it is throughout this disclosure), and the surface normal to the sample is taken as 0°, then the measurement of specular reflected light Rs is taken as an average in the range of about −19.95° to −20.05°, and Ros is taken as the average reflected intensity in the range of about −20.2° to −20.4° (or from −19.6° to −19.8°, or an average of both of these two ranges). As used herein, DOI values should be directly interpreted as specifying a target ratio of Ros/Rs as defined herein. In some embodiments, the anti-glare surface has a reflected scattering profile such that >95% of the reflected optical power is contained within a cone of +/−10°, where the cone is centered around the specular reflection direction for any input angle.

The resulting the anti-glare surface may include a textured surface with plurality of concave features having an opening facing outwardly from the surface. The opening may have an average cross-sectional dimension of about 30 micrometers or less. In one or more embodiments, the anti-glare surface exhibits low sparkle (in terms of low pixel power deviation reference or PPDr) such as PPDr of about 6% or less. As used herein, the terms "pixel power deviation referenced" and "PPDr" refer to the quantitative measurement for display sparkle. Unless otherwise specified, PPDr is measured using a display arrangement that includes an edge-lit liquid crystal display screen (twisted nematic liquid crystal display) having a native sub-pixel pitch of 60 μm×180 μm and a sub-pixel opening window size of about 44 μm×about 142 μm. The front surface of the liquid crystal display screen had a glossy, anti-reflection type linear polarizer film. To determine PPDr of a display system or an anti-glare surface that forms a portion of a display system, a screen is placed in the focal region of an "eye-simulator" camera, which approximates the parameters of the eye of a human observer. As such, the camera system includes an aperture (or "pupil aperture") that is inserted into the optical path to adjust the collection angle of light, and thus approximate the aperture of the pupil of the human eye. In the PPDr measurements described herein, the iris diaphragm subtends an angle of 18 milliradians.

The anti-reflective surface may be formed by a multi-layer coating stack formed from alternating layers of a high refractive index material and a low refractive index material. Such coatings stacks may include 6 layers or more. In one or more embodiment, the anti-reflective surface may exhibit a single-side average light reflectance of about 2% or less (e.g., about 1.5% or less, about 1% or less, about 0.75% or less, about 0.5% or less, or about 0.25% or less) over the optical wavelength regime in the range from about 400 nm to about 800 nm. The average reflectance is measured at an incident illumination angle greater than about 0 degrees to less than about 10 degrees.

The decorative surface may include any aesthetic design formed from a pigment (e.g., ink, paint and the like) and can include a wood-grain design, a brushed metal design, a graphic design, a portrait, or a logo. In one or more embodiments, the decorative surface exhibits a deadfront effect in which the decorative surface disguises or masks the underlying display from a viewer when the display is turned off but permits the display to be viewed when the display is turned on. The decorative surface may be printed onto the glass article. In one or more embodiments, the anti-glare surface includes an etched surface. In one or more embodiments, the anti-reflective surface includes a multi-layer coating. In one or more embodiments, the easy-to-clean surface includes an oleophobic coating that imparts anti-fingerprint properties. In one or more embodiments, the haptic surface includes a raised or recessed surface formed from depositing a polymer or glass material on the surface to provide a user with tactile feedback when touched.

Suitable glass compositions for use in the glass article include soda lime glass, aluminosilicate glass, borosilicate glass, boroaluminosilicate glass, alkali-containing aluminosilicate glass, alkali-containing borosilicate glass, and alkali-containing boroaluminosilicate glass.

Unless otherwise specified, the glass compositions disclosed herein are described in mole percent (mol %) as analyzed on an oxide basis.

In one or more embodiments, the glass composition may include $SiO_2$ in an amount in a range from about 60 mol % to about 80 mol %, from about 61 mol % to about 80 mol %, from about 62 mol % to about 80 mol %, from about 63 mol % to about 80 mol %, from about 64 mol % to about 80 mol %, from about 65 mol % to about 80 mol %, from about 66 mol % to about 80 mol %, from about 67 mol % to about 80 mol %, from about 68 mol % to about 80 mol %, from about 69 mol % to about 80 mol %, from about 70 mol % to about 80 mol %, from about 72 mol % to about 80 mol %, from about 60 mol % to about 78 mol %, from about 60 mol % to about 76 mol %, from about 60 mol % to about 75 mol %, from about 60 mol % to about 74 mol %, from about 60 mol % to about 72 mol %, or from about 60 mol % to about 70 mol %, and all ranges and sub-ranges therebetween.

In one or more embodiments, the glass composition includes $Al_2O_3$ in an amount greater than about 4 mol %, or greater than about 5 mol %. In one or more embodiments, the glass composition includes $Al_2O_3$ in a range from about 7 mol % to about 21 mol %, from about 8 mol % to about 21 mol %, from about 9 mol % to about 21 mol %, from greater than about 10 mol % to about 21 mol %, from about 12 mol % to about 21 mol %, from about 14 mol % to about 21 mol %, from about 15 mol % to about 21 mol %, from about 16 mol % to about 21 mol %, from about 18 mol % to about 21 mol %, from about 7 mol % to about 20 mol %, from about 7 mol % to about 18 mol %, from about 7 mol % to about 17 mol %, from about 7 mol % to about 16 mol %, from about 7 mol % to about 15 mol %, from about 7 mol % to about 14 mol %, from about 7 mol % to about 13 mol %, from about 12 mol % to about 18 mol %, from about 13 mol % to about 17 mol %, from about 14 mol % to about 18 mol %, or from about 12 mol % to about 17 mol %, and all ranges and sub-ranges therebetween.

In one or more embodiments, the glass article is described as an aluminosilicate glass article or including an aluminosilicate glass composition. In such embodiments, the glass composition or article formed therefrom includes $SiO_2$ and $Al_2O_3$ and is not a soda lime silicate glass. In this regard, the glass composition or article formed therefrom includes $Al_2O_3$ in an amount of about 2 mol % or greater, 2.25 mol % or greater, 2.5 mol % or greater, about 2.75 mol % or greater, about 3 mol % or greater.

In one or more embodiments, the glass composition comprises $B_2O_3$ (e.g., about 0.01 mol % or greater). In one or more embodiments, the glass composition comprises $B_2O_3$ in an amount in a range from about 0 mol % to about 5 mol %, from about 0 mol % to about 4 mol %, from about 0 mol % to about 3 mol %, from about 0 mol % to about 2 mol %, from about 0 mol % to about 1 mol %, from about 0 mol % to about 0.5 mol %, from about 0.1 mol % to about 5 mol %, from about 0.1 mol % to about 4 mol %, from about 0.1 mol % to about 3 mol %, from about 0.1 mol % to about 2 mol %, from about 0.1 mol % to about 1 mol %, from about 0.1 mol % to about 0.5 mol %, and all ranges and sub-ranges therebetween. In one or more embodiments, the glass composition is substantially free of $B_2O_3$.

As used herein, the phrase "substantially free" with respect to the components of the composition means that the component is not actively or intentionally added to the composition during initial batching, but may be present as an impurity in an amount less than about 0.001 mol %.

In one or more embodiments, the glass composition optionally comprises $P_2O_5$ (e.g., about 0.01 mol % or greater). In one or more embodiments, the glass composition comprises a non-zero amount of $P_2O_5$ up to and including 5 mol %, 4 mol %, 3 mol %, 2 mol %, 1.5 mol %, 1 mol %, or 0.5 mol %. In one or more embodiments, the glass composition is substantially free of $P_2O_5$.

In one or more embodiments, the glass composition may include a total amount of $R_2O$ (which is the total amount of alkali metal oxide such as $Li_2O$, $Na_2O$, $K_2O$, $Rb_2O$, and $Cs_2O$) that is greater than or equal to about 8 mol %, greater than or equal to about 10 mol %, or greater than or equal to about 12 mol %. In some embodiments, the glass composition includes a total amount of $R_2O$ in a range from about 8 mol % to about 20 mol %, from about 8 mol % to about 18 mol %, from about 8 mol % to about 16 mol %, from about 8 mol % to about 14 mol %, from about 8 mol % to about 12 mol %, from about 9 mol % to about 20 mol %, from about 10 mol % to about 20 mol %, from about 11 mol % to about 20 mol %, from about 12 mol % to about 20 mol %, from about 13 mol % to about 20 mol %, from about 10 mol % to about 14 mol %, or from about 11 mol % to about 13 mol %, and all ranges and sub-ranges therebetween. In one or more embodiments, the glass composition may be substantially free of $Rb_2O$, $Cs_2O$ or both $Rb_2O$ and $Cs_2O$. In one or more embodiments, the $R_2O$ may include the total amount of $Li_2O$, $Na_2O$ and $K_2O$ only. In one or more embodiments, the glass composition may comprise at least one alkali metal oxide selected from $Li_2O$, $Na_2O$ and $K_2O$, wherein the alkali metal oxide is present in an amount greater than about 8 mol % or greater.

In one or more embodiments, the glass composition comprises $Na_2O$ in an amount greater than or equal to about 8 mol %, greater than or equal to about 10 mol %, or greater than or equal to about 12 mol %. In one or more embodiments, the composition includes $Na_2O$ in a range from about from about 8 mol % to about 20 mol %, from about 8 mol % to about 18 mol %, from about 8 mol % to about 16 mol %, from about 8 mol % to about 14 mol %, from about 8 mol % to about 12 mol %, from about 9 mol % to about 20 mol %, from about 10 mol % to about 20 mol %, from about 11 mol % to about 20 mol %, from about 12 mol % to about 20 mol %, from about 13 mol % to about 20 mol %, from about 10 mol % to about 14 mol %, or from about 11 mol % to about 16 mol %, and all ranges and sub-ranges therebetween.

In one or more embodiments, the glass composition includes less than about 4 mol % $K_2O$, less than about 3 mol % $K_2O$, or less than about 1 mol % $K_2O$. In some instances, the glass composition may include $K_2O$ in an amount in a range from about 0 mol % to about 4 mol %, from about 0 mol % to about 3.5 mol %, from about 0 mol % to about 3 mol %, from about 0 mol % to about 2.5 mol %, from about 0 mol % to about 2 mol %, from about 0 mol % to about 1.5 mol %, from about 0 mol % to about 1 mol %, from about 0 mol % to about 0.5 mol %, from about 0 mol % to about 0.2 mol %, from about 0 mol % to about 0.1 mol %, from about 0.5 mol % to about 4 mol %, from about 0.5 mol % to about 3.5 mol %, from about 0.5 mol % to about 3 mol %, from about 0.5 mol % to about 2.5 mol %, from about 0.5 mol % to about 2 mol %, from about 0.5 mol % to about 1.5 mol %, or from about 0.5 mol % to about 1 mol %, and all ranges and sub-ranges therebetween. In one or more embodiments, the glass composition may be substantially free of $K_2O$.

In one or more embodiments, the glass composition comprises $Li_2O$ in an amount greater than or equal to about 0.5 mol %, greater than or equal to about 1 mol %, or greater than or equal to about 1.5 mol %. In one or more embodiments, the composition includes $Na_2O$ in a range from about from about 0.5 mol % to about 12 mol %, from about 1 mol % to about 12 mol %, from about 1.5 mol % to about 12 mol %, from about 2 mol % to about 12 mol %, from about 2.5 mol % to about 12 mol %, from about 3 mol % to about 12 mol %, from about 4 mol % to about 12 mol %, from about 5 mol % to about 12 mol %, from about 6 mol % to about 12 mol %, from about 0.5 mol % to about 11 mol %, from about 0.5 mol % to about 10 mol %, from about 0.5 mol % to about 9 mol %, from about 0.5 mol % to about 8 mol %, from about 0.5 mol % to about 7 mol %, from about 0.5 mol % to about 6 mol %, from about 3 mol % to about 8 mol %, from about 4 mol % to about 8 mol %, or from about 5 mol % to about 8 mol %, and all ranges and sub-ranges therebetween.

In one or more embodiments, the glass composition is substantially free of $Li_2O$.

In one or more embodiments, the amount of $Na_2O$ in the composition may be greater than the amount of $Li_2O$. In some instances, the amount of $Na_2O$ may be greater than the combined amount of $Li_2O$ and $K_2O$. In one or more alternative embodiments, the amount of $Li_2O$ in the composition may be greater than the amount of $Na_2O$ or the combined amount of $Na_2O$ and $K_2O$.

In one or more embodiments, the glass composition may include a total amount of RO (which is the total amount of alkaline earth metal oxide such as CaO, MgO, BaO, ZnO and SrO) in a range from about 0 mol % to about 2 mol %. In some embodiments, the glass composition includes a non-zero amount of RO up to about 2 mol %. In one or more embodiments, the glass composition comprises RO in an amount from about 0 mol % to about 1.8 mol %, from about 0 mol % to about 1.6 mol %, from about 0 mol % to about 1.5 mol %, from about 0 mol % to about 1.4 mol %, from about 0 mol % to about 1.2 mol %, from about 0 mol % to about 1 mol %, from about 0 mol % to about 0.8 mol %, from about 0 mol % to about 0.5 mol %, and all ranges and sub-ranges therebetween.

In one or more embodiments, the glass composition includes CaO in an amount less than about 1 mol %, less than about 0.8 mol %, or less than about 0.5 mol %. In one or more embodiments, the glass composition is substantially free of CaO.

In some embodiments, the glass composition comprises MgO in an amount from about 0 mol % to about 7 mol %, from about 0 mol % to about 6 mol %, from about 0 mol % to about 5 mol %, from about 0 mol % to about 4 mol %, from about 0.1 mol % to about 7 mol %, from about 0.1 mol % to about 6 mol %, from about 0.1 mol % to about 5 mol %, from about 0.1 mol % to about 4 mol %, from about 1 mol % to about 7 mol %, from about 2 mol % to about 6 mol %, or from about 3 mol % to about 6 mol %, and all ranges and sub-ranges therebetween.

In some embodiments, the glass composition comprises ZnO in an amount from about 0 mol % to about 7 mol %, from about 0 mol % to about 6 mol %, from about 0 mol % to about 5 mol %, from about 0 mol % to about 4 mol %, from about 0.1 mol % to about 7 mol %, from about 0.1 mol % to about 6 mol %, from about 0.1 mol % to about 5 mol %, from about 0.1 mol % to about 4 mol %, from about 1 mol % to about 7 mol %, from about 2 mol % to about 6 mol %, from about 3 mol % to about 6 mol %, or from about 1 mol % to about 3 mol %, and all ranges and sub-ranges therebetween.

In one or more embodiments, the glass composition comprises $ZrO_2$ in an amount equal to or less than about 0.2 mol %, less than about 0.18 mol %, less than about 0.16 mol %, less than about 0.15 mol %, less than about 0.14 mol %, less than about 0.12 mol %. In one or more embodiments, the glass composition comprises $ZrO_2$ in a range from about 0.01 mol % to about 0.2 mol %, from about 0.01 mol % to about 0.18 mol %, from about 0.01 mol % to about 0.16 mol %, from about 0.01 mol % to about 0.15 mol %, from about 0.01 mol % to about 0.14 mol %, from about 0.01 mol % to about 0.12 mol %, or from about 0.01 mol % to about 0.10 mol %, and all ranges and sub-ranges therebetween.

In one or more embodiments, the glass composition comprises $SnO_2$ in an amount equal to or less than about 0.2 mol %, less than about 0.18 mol %, less than about 0.16 mol %, less than about 0.15 mol %, less than about 0.14 mol %, less than about 0.12 mol %. In one or more embodiments, the glass composition comprises $SnO_2$ in a range from about 0.01 mol % to about 0.2 mol %, from about 0.01 mol % to about 0.18 mol %, from about 0.01 mol % to about 0.16 mol %, from about 0.01 mol % to about 0.15 mol %, from about 0.01 mol % to about 0.14 mol %, from about 0.01 mol % to about 0.12 mol %, or from about 0.01 mol % to about 0.10 mol %, and all ranges and sub-ranges therebetween.

In one or more embodiments, the glass composition may include an oxide that imparts a color or tint to the glass articles. In some embodiments, the glass composition includes an oxide that prevents discoloration of the glass article when the glass article is exposed to ultraviolet radiation. Examples of such oxides include, without limitation oxides of: Ti, V, Cr, Mn, Fe, Co, Ni, Cu, Ce, W, and Mo.

In one or more embodiments, the glass composition includes Fe expressed as $Fe_2O_3$, wherein Fe is present in an amount up to (and including) about 1 mol %. In some embodiments, the glass composition is substantially free of Fe. In one or more embodiments, the glass composition comprises $Fe_2O_3$ in an amount equal to or less than about 0.2 mol %, less than about 0.18 mol %, less than about 0.16 mol %, less than about 0.15 mol %, less than about 0.14 mol %, less than about 0.12 mol %. In one or more embodiments, the glass composition comprises $Fe_2O_3$ in a range from about 0.01 mol % to about 0.2 mol %, from about 0.01 mol % to about 0.18 mol %, from about 0.01 mol % to about 0.16 mol %, from about 0.01 mol % to about 0.15 mol %, from about 0.01 mol % to about 0.14 mol %, from about 0.01 mol % to about 0.12 mol %, or from about 0.01 mol % to about 0.10 mol %, and all ranges and sub-ranges therebetween.

Where the glass composition includes $TiO_2$, $TiO_2$ may be present in an amount of about 5 mol % or less, about 2.5 mol % or less, about 2 mol % or less or about 1 mol % or less. In one or more embodiments, the glass composition may be substantially free of $TiO_2$.

A second aspect of this disclosure pertains to automotive interior system that incorporates one or more embodiments of the glass articles described herein. In one or more embodiments, the automotive interior system includes a base, and a glass article disposed on the base. In one or more embodiments, when an impactor having a mass of 6.8 kg impacts the first major surface of the glass article at an impact velocity of 5.35 m/s to 6.69 m/s, the deceleration of the impactor is 120 g (g-force) or less. In one or more specific embodiments, the deceleration of the impactor is not greater than 80 g for any 3 ms interval over a time of impact. In one or more specific embodiments, when the impactor breaks the glass article, the glass article exhibits post-breakage visibility. In one or more embodiments, post-breakage visibility means the underlying display or icons are visible at viewing angles from normal to 15 degrees from normal. In one or more embodiments, post-breakage visibility means, when the glass article is disposed over a display and after the impactor breaks the glass article, the glass article breaks into fragments that are relatively large in size or are relatively few in number. In or more embodiments, minimum dimension (excluding thickness) of all of the fragments disposed over the display (and not over the non-display regions of the automotive interior system) is greater than 5%, 10%, greater than 20%, greater than 30% or greater than 40% of the surface area of the display. In one or more embodiments, the fragments over the display (and not over the non-display regions of the automotive interior system) having a minimum dimension greater than 5%, 10%, 20%, 30% or 40% of the surface area of the display number less than 20, less than 10, less than 5 or less than 3.

In one or more embodiments, the base comprises a support structure that can includes molded or machined plastics, composite, aluminum alloys, steel or stainless steel or any other material that provides support. In one or more embodiments, such bases may form a center console, a dashboard, an arm rest, a pillar, a seat back, a floor board, a headrest, a door panel, and a steering wheel. In one or more embodiments, the base may be a separate component that is integrated to form a center console, a dashboard, an arm rest, a pillar, a seat back, a floor board, a headrest, a door panel, and a steering wheel.

In one or more embodiments, the glass article used in the automotive interior system includes a compressive stress (CS) region with a surface compressive stress value in a range from about 900 MPa to about 1500 MPa; and a central tension (CT) region having a maximum CT value of about 60 MPa or less.

In one or more embodiments, the glass article is curved. In one or more specific embodiments, the glass article includes a first radius of curvature of about 200 mm or greater. In one or more embodiments, the base is curved and has a radius of curvature that is within 10% of the first radius of curvature. In one or more embodiments, the base may be flat or have a radius of curvature that is less than 200 mm, less than 100 mm, less than 50 mm, less than 25 mm, or less than 10 mm.

In one or more embodiments of the automotive interior system, when the glass article is in substantially flat configuration, the CT region has a maximum value ($CT_{flat}$) that is about 60 MPa or less. In one or more embodiments, the glass article is disposed on the base in a curved configuration and its CT region has a maximum value ($CT_{bend}$). In one or more specific embodiments, the curved glass article comprises the relationship $CT_{bend}/CT_{flat}<1.4$. In one or more embodiments, $CT_{bend}$, $CT_{flat}$ and the combined $CT_{bend}$ and $CT_{flat}$ value is less than the result of the equation (1).

In one or more embodiments, the glass article is in the cold bent configuration and comprises a conical surface, a cylindrical surface or a developable surface. In one or more embodiments, the first major surface of the glass article comprises a first major surface CS value that is in a range from about 900 MPa to about 1500 MPa, and the second major surface comprises a second major surface CS value that differs from the first major surface CS value.

In one or more embodiments, the automotive interior system includes a display or touch panel disposed on the first or second major surface of the glass article. In one or more embodiments, an adhesive is disposed between the first or second major surface and the display or touch panel. The glass articles used in the embodiments of the automotive interior systems described herein may include a surface treatment (as described herein).

A third aspect of this disclosure pertains to a method for forming a glass article. In one or more embodiments, the method includes strengthening a glass sheet having a first major surface, a second major surface, and a minor surface connecting the first major surface and the second major surface defining a thickness (t) to provide a first strengthened glass article having a first compressive stress (CS) region having a surface CS in a range from about 600 MPa to about 800 MPa, and a first central tension (CT) region. In one or more embodiments, the method includes and strengthening the first strengthened glass article to provide the glass article comprising a final CS region comprising a surface CS value in a range from about 900 MPa to about 1500 MPa, and a final CT stress region having a maximum CT value of about 60 MPa or less.

In one or more embodiments, the glass sheet may be strengthened mechanically by utilizing a mismatch of the coefficient of thermal expansion between portions of the article to create a compressive stress region and a central region exhibiting a tensile stress. In some embodiments, the glass sheet may be strengthened thermally by heating the glass to a temperature above the glass transition point and then rapidly quenching.

In one or more embodiments, the glass sheet may be chemically strengthening by ion exchange. In the ion exchange process, ions at or near the surface of the glass sheet are replaced by—or exchanged with—larger ions having the same valence or oxidation state. In those embodiments in which the glass sheet comprises an alkali aluminosilicate glass, ions in the surface layer of the sheet and the larger ions are monovalent alkali metal cations, such as Li+, Na+, K+, Rb+, and Cs+. Alternatively, monovalent cations in the surface layer may be replaced with monovalent cations other than alkali metal cations, such as Ag+ or the like. In such embodiments, the monovalent ions (or cations) exchanged into the glass sheet generate a stress.

Ion exchange processes are typically carried out by immersing a glass sheet (or article) in a molten salt bath (or two or more molten salt baths) containing the larger ions to be exchanged with the smaller ions in the glass sheet or article. It should be noted that aqueous salt baths may also be utilized. In addition, the composition of the bath(s) may include more than one type of larger ion (e.g., Na+ and K+) or a single larger ion. It will be appreciated by those skilled in the art that parameters for the ion exchange process, including, but not limited to, bath composition and temperature, immersion time, the number of immersions of the glass sheet or article in a salt bath (or baths), use of multiple salt baths, additional steps such as annealing, washing, and the like, are generally determined by the composition of the glass sheet or article (including the structure of the article and any crystalline phases present) and the desired DOC and CS of the glass sheet or article that results from strengthening. Exemplary molten bath composition may include nitrates, sulfates, and chlorides of the larger alkali metal ion. Typical nitrates include KNO3, NaNO3, LiNO3, NaSO4 and combinations thereof. The temperature of the molten salt bath typically is in a range from about 380° C. up to about 450° C., while immersion times range from about 15 minutes up to about 100 hours depending on glass sheet or article thickness, bath temperature and glass (or monovalent ion) diffusivity. However, temperatures and immersion times different from those described above may also be used.

In one or more embodiments, the glass sheet or articles may be immersed in a molten salt bath of 100% NaNO3, 100% KNO3, or a combination of NaNO3 and KNO3 having a temperature from about 370° C. to about 480° C. In some embodiments, the glass sheet or article may be immersed in a molten mixed salt bath including from about 1% to about 99% KNO3 and from about 1% to about 99% NaNO3. In one or more embodiments, the glass sheet or article may be immersed in a second bath, after immersion in a first bath. The first and second baths may have different compositions and/or temperatures from one another. The immersion times in the first and second baths may vary. For example, immersion in the first bath may be longer than the immersion in the second bath.

In one or more embodiments, the glass sheet or article may be immersed in a molten, mixed salt bath including NaNO3 and KNO3 (e.g., 49%/51%, 50%/50%, 51%/49%) having a temperature less than about 420° C. (e.g., about 400° C. or about 380° C.). for less than about 5 hours, or even about 4 hours or less.

Ion exchange conditions can be tailored to provide a spike region at or near the surface of the resulting glass sheet or article. The spike region may result in a greater surface CS value. This spike region can be achieved by single bath or multiple baths, with the bath(s) having a single composition or mixed composition, due to the unique properties of the glass compositions used in the glass sheet or articles described herein.

In one or more embodiments, where more than one monovalent ion is exchanged into the glass sheet or article, the different monovalent ions may exchange to different depths within the glass sheet or article (and generate different magnitudes stresses within the glass sheet or article at different depths). The resulting relative depths of the stress-generating ions can be determined and cause different characteristics of the stress profile (e.g., a spike region, a knee region, and a tail region). The shape of the stress profile in the CT region may also be determined by the ion exchange conditions.

In one or more specific embodiments, the method includes chemically strengthening the glass sheet comprises immersing the glass sheet in a molten salt bath of $KNO_3$, $NaNO_3$ or a combination of $KNO_3$ and $NaNO_3$, having a temperature in a range from about 310° C. to about 450° C., for a duration of from about 2 hours to about 40 hours.

In one or more embodiments, the method includes strengthening the first strengthened glass article by chemically strengthening the glass article. In one or more specific embodiments, chemically strengthening the glass article comprises immersing the glass sheet in a molten salt bath of $KNO_3$, $NaNO_3$ or a combination of $KNO_3$ and $NaNO_3$, having a temperature in a range from about 310° C. to about 450° C., for a duration of from about 2 hours to about 40 hours.

A fourth aspect of this disclosure pertains to a method for forming an automotive interior system comprising: affixing a display or touch panel to a cold-bent glass article, wherein the glass article comprises the glass article according to one or more embodiments to provide a module; and affixing the module to a base of an automotive interior system. In one or more embodiments, affixing the display or touch panel to the cold-bent glass article comprises cold-bending the glass article before affixing the display or touch panel to the cold-bent glass article. In one or more embodiments, affixing the display or touch panel to the cold-bent glass article comprises cold-bending the glass article occurs simultaneously with affixing the display or touch panel to the cold-bent glass article.

In one or more embodiments, a portion of the first major surface of the cold-bent article can include concave surface and the opposing portion of the second major surface comprises a convex surface.

The method of one or more embodiments includes affixing the display or touch panel to the first major surface. In one or more embodiments, the method includes affixing the display or touch panel to the second major surface. In one or more embodiments, the method includes disposing an adhesive layer between the cold-bent glass article and the display or touch panel.

EXAMPLES

Various embodiments will be further clarified by the following examples.

Figure 9:
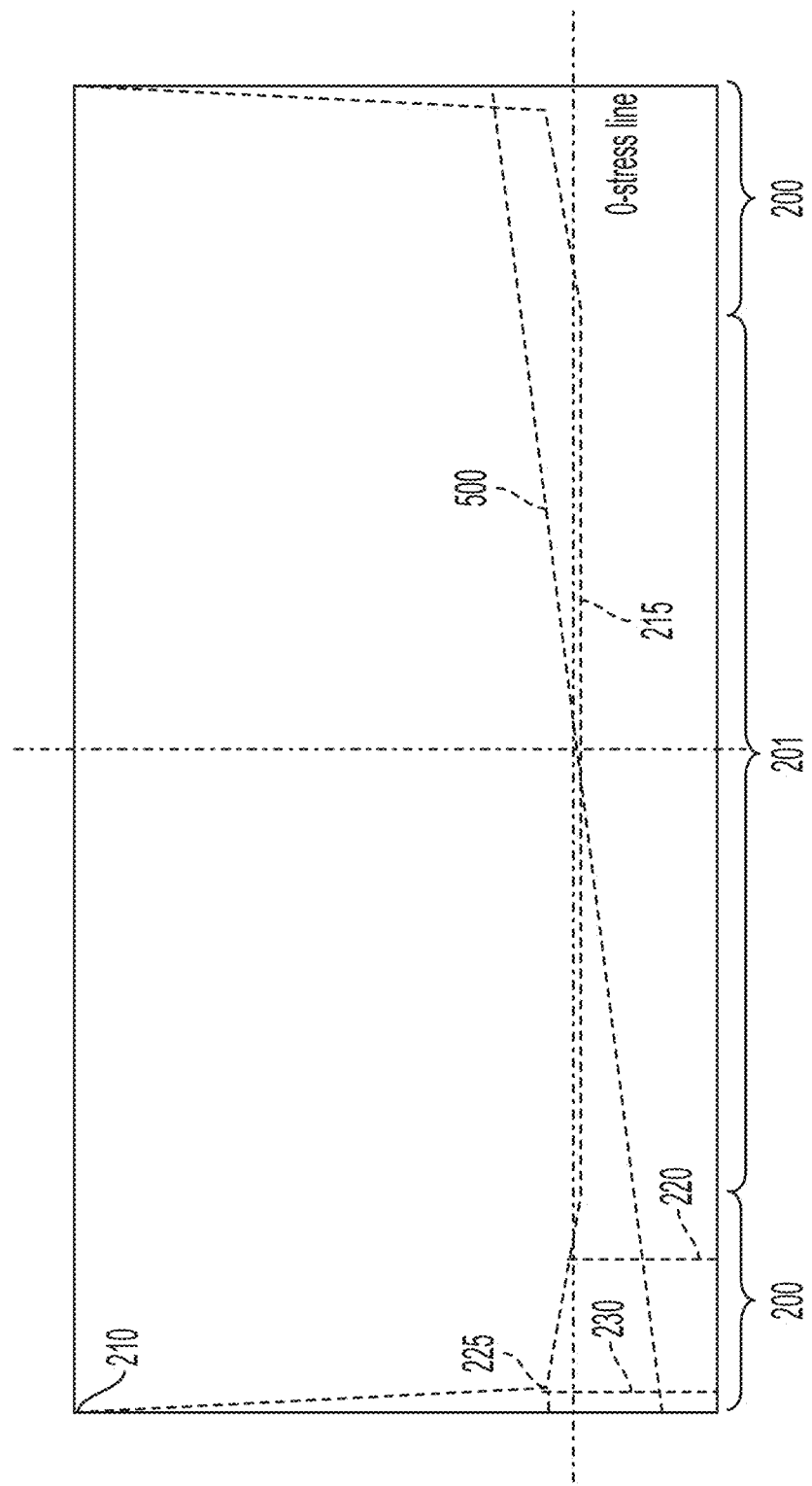
FIG. 9 is a cross-sectional view of a modeled glass article according to one or more embodiments showing a stress profile with a substantially flat or linear CT region.

An exemplary glass article including a modeled stress profile with a substantially flat or linear CT region is shown in FIG. 9. In FIG. 9, the CS region 200 has a surface CS 210 that is in a range from about 1000 MPa to about 1500 MPa. The knee stress 225 is in a range from about 50 MPa to about 200 MPa. The DOL 230 is in a range from about 10 micrometers to about 20 micrometers and DOC 220 is up to about 0.2 t. The maximum CT 215 can be as low as about 20 MPa. In one or more embodiments, the maximum CT is in a range from about 20 MPa to about 60 MPa. In FIG. 9, a modeled bend induced stress 500 is superimposed to show, when the glass article is cold-bent, the concave surface of the cold-bent glass article experiences increased compressive stress and the convex surface of the cold-bent glass article experiences increased tensile stress.

An exemplary glass article including a modeled stress profile with a parabolic-like CT region is shown in FIG. 10. In FIG. 10, the CS region 200 has a surface CS 210 that is in a range from about 1000 MPa to about 1500 MPa. The knee stress 225 is in a range from about 50 MPa to about 200 MPa. The DOL 230 is in a range from about 10 micrometers to about 20 micrometers and DOC 220 is up to about 0.2 t. The maximum CT 215 can be as low as about 20 MPa. In one or more embodiments, the maximum CT is in a range from about 20 MPa to about 60 MPa. In FIG. 10, at least a portion of the stress profile 217 in the CT region has a parabolic-like shape. In FIG. 10, a modeled bend induced stress 500 is superimposed to show, when the glass article is cold-bent, the concave surface of the cold-bent glass article experiences increased compressive stress and the convex surface of the cold-bent glass article experiences increased tensile stress.

Aspect (1) of this disclosure pertains to a glass article comprising: a first major surface, a second major surface, a minor surface connecting the first major surface and the second major surface, and a thickness (t) (millimeters); a compressive stress (CS) region; and a central tension (CT) region, wherein the CS region and the CT region define a stress profile along the thickness, wherein a portion of the CS region extends from the first major surface to a depth of compression (DOC), wherein, when the glass article is in a substantially flat configuration, the CT region has a maximum value ($CT_{flat}$) that is about 60 MPa or less, and wherein, when the glass article is in a cold bent configuration, CT region comprises a maximum value ($CT_{bent}$), wherein $CT_{bent}/CT_{flat}<1.4$.

Aspect (2) of this disclosure pertains to the glass article of Aspect (1), wherein the $CT_{flat}$ is about 40 MPa or less.

Aspect (3) of this disclosure pertains to the glass article of Aspect (1) or Aspect (2), wherein the $CT_{flat}$ is about 20 MPa or less.

Aspect (4) of this disclosure pertains to the glass article of any one of Aspects (1) through (3), wherein the portion of the CS region comprises a spike region, a tail region and a knee region between the spike region and the tail region, wherein all points of the stress profile in the spike region comprise a tangent having a slope that is in a range from −200 MPa/micrometer to −15 MPa/micrometer and all points in the tail region comprise a tangent having a slope that is in a range from −3 MPa/micrometer to −0.01 MPa/micrometer.

Aspect (5) of this disclosure pertains to the glass article of Aspect (4), wherein the spike region comprises a CS value in a range from greater than 200 MPa to about 1500 MPa.

Aspect (6) of this disclosure pertains to the glass article of Aspect (4) or Aspect (5), wherein the knee region comprises a CS value in a range from about 50 MPa to about 200 MPa.

Aspect (7) of this disclosure pertains to the glass article of Aspect (6), wherein the knee region extends from about 10 micrometers to about 50 micrometers from the first major surface.

Aspect (8) of this disclosure pertains to the glass article of any one of Aspects (4) through (7), wherein the tail region extends from about the knee region to the DOC, wherein the DOC is up to about 0.25 t.

Aspect (9) of this disclosure pertains to the glass article of any one of Aspects (1) through (8), wherein CTbend, CTflat and the combined CTbend and CTflat is less than the result of the equation, 52.029–42.032*LN(t).

Aspect (10) of this disclosure pertains to the glass article of any one of Aspects (1) through (9), wherein all points of the stress profile along at least a portion of the CT region comprises comprise a tangent having a slope that is in a range from 1 MPa/micrometer to −1 MPa/micrometer.

Aspect (11) of this disclosure pertains to the glass article of Aspect (10), wherein the at least 50% of the CT region comprises the tangent having a slope that is in a range from 1 MPa/micrometer to −1 MPa/micrometer.

Aspect (12) of this disclosure pertains to the glass article of any one of Aspects (1) through (9), wherein all points of the stress profile in the tail region form a power-law profile having a power exponent, wherein the power exponent is in a range from about 1.2 to 3.4.

Aspect (13) of this disclosure pertains to the glass article of any one of Aspects (1) through (9) and Aspect (12), wherein all points of the stress profile along at least a portion of the CT region form a power-law profile having a power exponent, wherein the power exponent is in a range from about 1.2 to 3.4.

Aspect (14) of this disclosure pertains to the glass article of Aspect (13), wherein all points of the stress profile along the CT region form a power-law profile having a power exponent, wherein the power exponent is in a range from about 1.2 to 3.4.

Aspect (15) of this disclosure pertains to the glass article of any one of Aspects (1) through (14), wherein the glass article is in a substantially flat configuration.

Aspect (16) of this disclosure pertains to the glass article of any one of Aspects (1) through (14), wherein the glass article is in the cold bent configuration and comprises a conical surface, a cylindrical surface or a developable surface.

Aspect (17) of this disclosure pertains to the glass article of Aspect (16), wherein the first major surface comprises a first major surface CS value that is in a range from about 900 MPa to about 1500 MPa, and the second major surface comprises a second major surface CS value that differs from the first major surface CS value.

Aspect (18) of this disclosure pertains to the glass article of Aspect (16) or Aspect (17), wherein at least a portion of the first major surface forms a concave surface, and at the opposing portion of the second major surface forms a convex surface.

Aspect (19) of this disclosure pertains to the glass article of any one of Aspects (15) through (18), further comprising a display or touch panel disposed on the first or second major surface.

Aspect (20) of this disclosure pertains to the glass article of Aspect (19), further comprising an adhesive disposed between the first or second major surface and the display or touch panel.

Aspect (21) of this disclosure pertains to the glass article of any one of Aspects (16) through (20), at least a portion of the first or second major surface comprise a radius of curvature in a range from about 20 mm to about 10000 mm.

Aspect (22) of this disclosure pertains to the glass article of any one of Aspects (1) through (21), wherein t is in a range from about 0.1 mm to about 2 mm.

Aspect (23) of this disclosure pertains to the glass article of any one of Aspects (1) through (22), wherein either one of or both the first major surface and the second major surface comprises a surface treatment.

Aspect (24) of this disclosure pertains to the glass article of Aspect (23), wherein the surface treatment covers at least a portion of the first major surface and the second major surface.

Aspect (25) of this disclosure pertains to the glass article of Aspect (23) or Aspect (24), wherein the surface treatment comprises any one of an easy-to-clean surface, an anti-glare surface, an anti-reflective surface, a haptic surface, and a decorative surface.

Aspect (26) of this disclosure pertains to the glass article of Aspect (25), wherein the surface treatment comprises at least two of any one of an easy-to-clean surface, an anti-glare surface, an anti-reflective surface, a haptic surface, and a decorative surface.

Aspect (27) of this disclosure pertains to the glass article of Aspect (26), wherein the first major surface comprises the anti-glare surface and the second major surface comprises the anti-reflective surface.

Aspect (28) of this disclosure pertains to the glass article of Aspect (26), wherein the first major surface comprises the anti-reflective surface and the second major surface comprises the anti-glare surface.

Aspect (29) of this disclosure pertains to the glass article of Aspect (26), wherein the first major surface comprises either one of or both the anti-glare surface and the anti-reflective surface, and the second major surface comprises the decorative surface.

Aspect (30) of this disclosure pertains to the glass article of Aspect (26), wherein the decorative surface is disposed on at least a portion of the periphery and the interior portion is substantially free of the decorative surface.

Aspect (31) of this disclosure pertains to the glass article of any one of Aspects (26) through (30), wherein the decorative surface comprises any one of a wood-grain design, a brushed metal design, a graphic design, a portrait, and a logo.

Aspect (32) of this disclosure pertains to the glass article of any one of Aspects (26) through (31), wherein the anti-glare surface comprises an etched surface, and wherein the anti-reflective surface comprises a multi-layer coating.

Aspect (33) pertains to an automotive interior system comprising: a base; and a glass article disposed on the base, wherein the glass article comprises a first major surface, a second major surface having a first radius of curvature of about 200 mm or greater, a minor surface connecting the first major surface and the second major surface and defining a thickness (t), a compressive stress (CS) region with a surface compressive stress value in a range from about 900 MPa to about 1500 MPa; and a central tension (CT) region having a maximum CT value of about 60 MPa or less, wherein the CS region and the CT region define a stress profile along the thickness, wherein a portion of the CS region extends from the first major surface to a depth of compression (DOC); and wherein, when an impactor having a mass of 6.8 kg impacts the first major surface at an impact velocity of 5.35 m/s to 6.69 m/s, the deceleration of the impactor is 120 g (g-force) or less.

Aspect (34) pertains to an automotive interior system of Aspect (33), wherein the deceleration of the impactor is not greater than 80 g for any 3 ms interval over a time of impact.

Aspect (35) pertains to an automotive interior system of Aspect (33) or Aspect (34), wherein, when the impactor breaks the glass article, the glass article exhibits post-breakage visibility.

Aspect (36) pertains to an automotive interior system of any one of Aspects (33) through (35), wherein the base is curved and has a radius of curvature that is within 10% of the first radius of curvature.

Aspect (37) pertains to an automotive interior system of any one of Aspects (33) through (35), wherein the base is flat.

Aspect (38) pertains to an automotive interior system of any one of Aspects (33) through (37), wherein the portion of the CS region comprises a spike region, a tail region and a knee region between the spike region and the tail region, wherein all points of the stress profile in the spike region comprise a tangent having a slope that is in a range from −200 MPa/micrometer to −15 MPa/micrometer and all points in the tail region comprise a tangent having a slope that is in a range from −3 MPa/micrometer to −0.01 MPa/micrometer.

Aspect (39) pertains to an automotive interior system of any one of Aspect (38), wherein the spike region comprises a CS value in a range from greater than 200 MPa to about 1500 MPa.

Aspect (40) pertains to an automotive interior system of Aspect (38) or Aspect (39), wherein the knee region comprises a CS value in a range from about 50 MPa to about 200 MPa.

Aspect (41) pertains to an automotive interior system of Aspect (40), wherein the knee region extends from about 10 micrometers to about 50 micrometers from the first major surface.

Aspect (42) pertains to an automotive interior system of any one of Aspects (38) through (41), wherein the tail region extends from about the knee region to the DOC.

Aspect (43) pertains to an automotive interior system of any one of Aspects (38) through (42), wherein the DOC is up to about 0.25 t.

Aspect (44) pertains to an automotive interior system of any one of Aspects (33) through (43), wherein, when the glass article is in substantially flat configuration, the CT region has a maximum value ($CT_{flat}$) that is about 60 MPa or less, wherein the glass article is in a curved configuration and comprises the CT region comprises a maximum value ($CT_{bend}$) and a relationship $CT_{bend}/CT_{flat}<1.4$.

Aspect (45) pertains to an automotive interior system of Aspect (44), wherein CTbend, CTflat and the combined CTbend and CTflat is less than the result of the equation, 52.029−42.032*LN(t).

Aspect (46) pertains to an automotive interior system of any one of Aspects (33) through (45), wherein the glass article is in the cold bent configuration and comprises a conical surface, a cylindrical surface or a developable surface.

Aspect (47) pertains to an automotive interior system of Aspect (46), wherein the first major surface comprises a first major surface CS value that is in a range from about 900 MPa to about 1500 MPa, and the second major surface comprises a second major surface CS value that differs from the first major surface CS value.

Aspect (48) pertains to an automotive interior system of Aspect (46) or Aspect (47), wherein at least a portion of the first major surface forms a concave surface, and at the opposing portion of the second major surface forms a convex surface.

Aspect (49) pertains to an automotive interior system of any one of Aspects (46) through (48), further comprising a display or touch panel disposed on the first or second major surface.

Aspect (50) pertains to an automotive interior system of Aspect (49), further comprising an adhesive disposed between the first or second major surface and the display or touch panel.

Aspect (51) pertains to an automotive interior system of any one of Aspects (33) through (50), wherein t is in a range from about 0.1 mm to about 2 mm.

Aspect (52) pertains to an automotive interior system of any one of Aspects (33) through (51), wherein either one of or both the first major surface and the second major surface comprises a surface treatment.

Aspect (53) pertains to an automotive interior system of Aspect (52), wherein the surface treatment covers at least a portion of the first major surface and the second major surface.

Aspect (54) pertains to an automotive interior system of Aspect (52) or Aspect (53), wherein the surface treatment comprises any one of an easy-to-clean surface, an anti-glare surface, an anti-reflective surface, a haptic surface, and a decorative surface.

Aspect (55) pertains to an automotive interior system of Aspect (54), wherein the surface treatment comprises at least two of any one of an easy-to-clean surface, an anti-glare surface, an anti-reflective surface, a haptic surface, and a decorative surface.

Aspect (56) pertains to an automotive interior system of Aspect (55), wherein the first major surface comprises the anti-glare surface and the second major surface comprises the anti-reflective surface.

Aspect (57) pertains to an automotive interior system of Aspect (55), wherein the first major surface comprises the anti-reflective surface and the second major surface comprises the anti-glare surface.

Aspect (58) pertains to an automotive interior system of Aspect (55), wherein the first major surface comprises either one of or both the anti-glare surface and the anti-reflective surface, and the second major surface comprises the decorative surface.

Aspect (59) pertains to an automotive interior system of Aspect (55), wherein the decorative surface is disposed on at least a portion of the periphery and the interior portion is substantially free of the decorative surface.

Aspect (60) pertains to an automotive interior system of any one of Aspects (55) through (59), wherein the decorative surface comprises any one of a wood-grain design, a brushed metal design, a graphic design, a portrait, and a logo.

Aspect (61) pertains to an automotive interior system of any one of Aspects (55) through (60), wherein the anti-glare surface comprises an etched surface, and wherein the anti-reflective surface comprises a multi-layer coating.

Aspect (62) pertains to a method for forming a glass article comprising: strengthening a glass sheet having a first major surface, a second major surface, and a minor surface connecting the first major surface and the second major surface defining a thickness (t) to provide a first strengthened glass article having a first compressive stress (CS) region having a CS in a range from about 600 MPa to about 800 MPa, and a first central tension (CT) region; and strengthening the first strengthened glass article to provide the glass article comprising a final CS region comprising a surface CS value in a range from about 900 MPa to about 1500 MPa, and a final CT stress region having a maximum CT value of about 60 MPa or less.

Aspect (63) pertains to the method of Aspect (62), wherein strengthening the glass sheet comprises chemically strengthening the glass sheet.

Aspect (64) pertains to the method of Aspect (63), wherein chemically strengthening the glass sheet comprises immersing the glass sheet in a molten salt bath of KNO₃, NaNO₃ or a combination of KNO₃ and NaNO₃, having a temperature in a range from about 310° C. to about 450° C., for a duration of from about 2 hours to about 40 hours.

Aspect (65) pertains to the method of Aspect (62), wherein strengthening the glass sheet comprises thermally strengthening the glass sheet.

Aspect (66) pertains to the method of any one of Aspects (62) through (65), wherein strengthening the first strengthened glass article comprises chemically strengthening the glass article.

Aspect (67) pertains to the method of Aspect (66), wherein chemically strengthening the glass article comprises immersing the glass sheet in a molten salt bath of KNO₃, NaNO₃ or a combination of KNO₃ and NaNO₃, having a temperature in a range from about 310° C. to about 450° C., for a duration of from about 2 hours to about 40 hours.

Aspect (68) pertains to a method for forming an automotive interior system comprising: affixing a display or touch panel to a cold-bent glass article, wherein the glass article comprises the glass article according to any one of Aspects (1) through (61) to provide a module; and affixing the module to a base of an automotive interior system.

Aspect (69) pertains to the method of Aspect (68), wherein affixing the display or touch panel to the cold-bent glass article comprises cold-bending the glass article before affixing the display or touch panel to the cold-bent glass article.

Aspect (70) pertains to the method of Aspect (69), wherein affixing the display or touch panel to the cold-bent glass article comprises cold-bending the glass article occurs simultaneously with affixing the display or touch panel to the cold-bent glass article.

Aspect (71) pertains to the method of any one of Aspects (68) through (70), wherein a portion of the first major surface of the cold-bent article comprises a concave surface and the opposing portion of the second major surface comprises a convex surface.

Aspect (72) pertains to the method of Aspect (71), further comprises affixing the display or touch panel to the first major surface.

Aspect (73) pertains to the method of Aspect (71), further comprises affixing the display or touch panel to the second major surface.

Aspect (74) pertains to the method of any one of Aspects (68) through (73), further comprises disposing an adhesive layer between the cold-bent glass article and the display or touch panel.

It will be apparent to those skilled in the art that various modifications and variations can be made without departing from the spirit or scope of the invention.

What is claimed is:

1. A glass article configured to be placed over a display of an automotive interior system, the glass article comprising:
 a first major surface, a second major surface, a minor surface connecting the first major surface and the second major surface, and a thickness (t) (millimeters) in a range from about 0.1 mm to about 0.8 mm;
 a compressive stress (CS) region; and
 a central tension (CT) region,
 wherein the CS region and the CT region define a stress profile along the thickness,
 wherein all points of the stress profile along at least a portion of the CT region form a power-law profile having a power exponent, wherein the power exponent is in a range from about 1.2 to 3.4;
 wherein a portion of the CS region extends from the first major surface to a depth of compression (DOC),
 wherein the glass article is configured to convert from a flat configuration in which the CT region has a maximum value ($CT_{flat}$) that is about 60 MPa or less to a cold bent configuration, wherein the glass article in the cold bent configuration comprises a maximum tensile value ($CT_{bent}$), wherein $CT_{bent}/CT_{flat}<1.4$; and
 wherein, after an impactor having a mass of 6.8 kg impacts the first major surface at an impact velocity of 5.35 m/s to 6.69 m/s, the glass article breaks into fragments having a minimum dimension that is greater than 5% of a surface area of the display over which the glass article is configured to be placed.

2. The glass article of claim 1, wherein the $CT_{flat}$ is about 40 MPa or less.

3. The glass article of claim 1, wherein the $CT_{flat}$ is about 20 MPa or less.

4. The glass article of claim 1, wherein the portion of the CS region comprises a spike region, a tail region and a knee region between the spike region and the tail region, wherein all points of the stress profile in the spike region comprise a tangent having a slope that is in a range from −200 MPa/micrometer to −15 MPa/micrometer and all points in the tail region comprise a tangent having a slope that is in a range from −3 MPa/micrometer to −0.01 MPa/micrometer.

5. The glass article of claim 4, wherein the spike region comprises a CS value in a range from greater than 200 MPa to about 1500 MPa.

6. The glass article of claim 4, wherein the knee region comprises a C S value in a range from about 50 MPa to about 200 MPa.

7. The glass article of claim 6, wherein the knee region extends from about 10 micrometers to about 50 micrometers from the first major surface.

8. The glass article of claim 4, wherein the tail region extends from about the knee region to the DOC, wherein the DOC is up to about 0.25t.

9. The glass article of claim 1, wherein at least one of $CT_{bend}$, $CT_{flat}$ and the combined $CT_{bend}$ and $CT_{flat}$ is less than the result of the equation, 52.029−42.032*ln(t).

10. The glass article of claim 1, wherein all points of the stress profile along at least a portion of the CT region comprises comprise a tangent having a slope that is in a range from 1 MPa/micrometer to −1 MPa/micrometer.

11. The glass article of claim 10, wherein the at least 50% of the CT region comprises the tangent having a slope that is in a range from 1 MPa/micrometer to −1 MPa/micrometer.

12. The glass article of claim 4, wherein all points of the stress profile in the tail region form a power-law profile having a power exponent, wherein the power exponent is in a range from about 1.2 to 3.4.

13. The glass article of claim 1, wherein all points of the stress profile along the CT region form a power-law profile having a power exponent, wherein the power exponent is in a range from about 1.2 to 3.4.

14. The glass article of claim 1, wherein the glass article is in a flat configuration.

15. The glass article of claim 1, wherein the glass article is in the cold bent configuration and comprises a conical surface, a cylindrical surface or a developable surface.

16. The glass article of claim 15, wherein the first major surface comprises a first major surface CS value that is in a range from about 900 MPa to about 1500 MPa, and the second major surface comprises a second major surface CS value that differs from the first major surface CS value.

17. The glass article of claim 14, further comprising a display or touch panel disposed on the first or second major surface.

18. The glass article of claim 17, further comprising an adhesive disposed between the first or second major surface and the display or touch panel.

19. The glass article of claim 15, at least a portion of the first or second major surface comprise a radius of curvature in a range from about 20 mm to about 10,000 mm.

20. The glass article of claim 1, wherein t is in a range from about 0.1 mm to about 2 mm.

21. The glass article of claim 1, wherein either one of or both the first major surface and the second major surface comprises a surface treatment.

22. The glass article of claim 21, wherein the surface treatment covers at least a portion of the first major surface and the second major surface.

23. The glass article of claim 21, wherein the surface treatment comprises any one of an easy-to-clean surface, an anti-glare surface, an anti-reflective surface, a haptic surface, and a decorative surface.

24. The glass article of 23, wherein the surface treatment comprises at least two of any one of an easy-to-clean surface, an anti-glare surface, an anti-reflective surface, a haptic surface, and a decorative surface.

25. The glass article of claim 24, wherein the first major surface comprises the antiglare surface and the second major surface comprises the anti-reflective surface.

26. The glass article of claim 24, wherein the first major surface comprises the antireflective surface and the second major surface comprises the anti-glare surface.

27. The glass article of claim 24, wherein the first major surface comprises either one of or both the anti-glare surface and the anti-reflective surface, and the second major surface comprises the decorative surface.

28. The glass article of claim 24, wherein the decorative surface is disposed on at least a portion of the periphery and the interior portion is substantially free of the decorative surface.

29. The glass article of claim 24, wherein the anti-glare surface comprises an etched surface, and wherein the anti-reflective surface comprises a multi-layer coating.

30. The glass article of claim 1, wherein, after the impactor impacts the first major surface, a deceleration of the impactor is not greater than 80 g for any 3 ms interval over a time of impact.

* * * * *

UNITED STATES PATENT AND TRADEMARK OFFICE
CERTIFICATE OF CORRECTION

| | | |
|---|---|---|
| PATENT NO. | : 11,078,111 B2 | Page 1 of 1 |
| APPLICATION NO. | : 16/517105 | |
| DATED | : August 3, 2021 | |
| INVENTOR(S) | : Matthew Lee Black et al. | |

It is certified that error appears in the above-identified patent and that said Letters Patent is hereby corrected as shown below:

In the Claims

In Column 28, Line 34, Claim 6, delete "C S value" and insert -- CS value --, therefor.

In Column 28, Line 47, Claim 10, delete "comprises comprise" and insert -- comprises --, therefor.

In Column 29, Line 24, Claim 24, delete "of 23," and insert -- of claim 23, --, therefor.

In Column 30, Line 4, Claim 25, delete "antiglare" and insert -- anti-glare --, therefor.

In Column 30, Line 7, Claim 26, delete "antireflective" and insert -- anti-reflective --, therefor.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*